US009558836B2

(12) United States Patent
Mui et al.

(10) Patent No.: US 9,558,836 B2
(45) Date of Patent: Jan. 31, 2017

(54) COMPACT HIGH SPEED SENSE AMPLIFIER FOR NON-VOLATILE MEMORY WITH REDUCED LAYOUT AREA AND POWER CONSUMPTION

(71) Applicant: SanDisk Technologies LLC, Plano, TX (US)

(72) Inventors: Man Lung Mui, Fremont, CA (US); Jongmin Park, Cupertino, CA (US); Hao Thai Nguyen, San Jose, CA (US); Seungpil Lee, San Ramon, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/852,854

(22) Filed: Sep. 14, 2015

(65) Prior Publication Data
US 2016/0035430 A1    Feb. 4, 2016

Related U.S. Application Data

(60) Division of application No. 13/605,424, filed on Sep. 6, 2012, now abandoned, which is a
(Continued)

(51) Int. Cl.
*G11C 16/26*    (2006.01)
*G11C 16/28*    (2006.01)
(Continued)

(52) U.S. Cl.
CPC .............. *G11C 16/26* (2013.01); *G11C 7/067* (2013.01); *G11C 11/5642* (2013.01); *G11C 16/3436* (2013.01); *G11C 16/28* (2013.01)

(58) Field of Classification Search
CPC .................. G11C 16/26; G11C 16/28
(Continued)

(56) References Cited

U.S. PATENT DOCUMENTS 4,785,427 A    11/1988 Young
5,070,032 A    12/1991 Yuan et al.
(Continued)

FOREIGN PATENT DOCUMENTS

EP    0 974 976 A1    1/2000
EP    1 288 964 A2    3/2003
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
(Continued)

*Primary Examiner* — Ly D Pham
(74) *Attorney, Agent, or Firm* — Stoel Rives LLP

(57) ABSTRACT

A compact and versatile high speed sense amplifier suitable for use in non-volatile memory circuits is presented. The sense amp circuit is connected to first and second supply levels, a first level used for setting a program inhibit level on bit lines and a second level used for pre-charging bit lines for sensing operation. Outside of a data latch, the sense amp can employ only NMOS transistors. The arrangement of the circuit also allows for the discharging the bit line at the same time as transfers the sensing result out to other latches.

20 Claims, 21 Drawing Sheets

Related U.S. Application Data continuation-in-part of application No. 13/536,758, filed on Jun. 28, 2012, now abandoned.

(51) Int. Cl.
    *G11C 7/06*     (2006.01)
    *G11C 11/56*     (2006.01)
    *G11C 16/34*     (2006.01)

(58) Field of Classification Search
    USPC .................................... 365/185.18, 185.21
    See application file for complete search history.

(56) References Cited

U.S. PATENT DOCUMENTS

| | | | |
|---|---|---|---|
| 5,095,344 | A | 3/1992 | Harari et al. |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan et al. |
| 5,768,192 | A | 6/1998 | Eitan |
| 5,781,478 | A | 7/1998 | Takeuchi et al. |
| 5,903,495 | A | 5/1999 | Takeuchi et al. |
| 6,011,725 | A | 1/2000 | Eitan |
| 6,031,760 | A * | 2/2000 | Sakui .................. G11C 16/10 365/185.21 |
| 6,046,935 | A | 4/2000 | Takeuchi et al. |
| 6,198,677 | B1 | 3/2001 | Hsu et al. |
| 6,222,762 | B1 | 4/2001 | Guterman et al. |
| 6,490,199 | B2 | 12/2002 | Lee et al. |
| 6,657,891 | B1 | 12/2003 | Shibata et al. |
| 6,717,857 | B2 * | 4/2004 | Byeon ................ G06F 12/0893 365/185.17 |
| 7,046,568 | B2 | 5/2006 | Cernea |
| 7,173,854 | B2 | 2/2007 | Cernea et al. |
| 7,206,235 | B1 | 4/2007 | Lutze et al. |
| 7,345,928 | B2 | 3/2008 | Li |
| 7,376,030 | B2 | 5/2008 | Cernea |
| 7,391,649 | B2 | 6/2008 | Kang et al. |
| 7,447,079 | B2 | 11/2008 | Nguyen et al. |
| 7,518,945 | B2 | 4/2009 | Kim |
| 7,593,265 | B2 | 9/2009 | Nguyen et al. |
| 7,957,197 | B2 | 6/2011 | Nguyen et al. |
| 7,978,526 | B2 | 7/2011 | Nguyen et al. |
| 8,630,120 | B2 | 1/2014 | She et al. |
| 8,705,293 | B2 | 4/2014 | She et al. |
| 2001/0014035 | A1 | 8/2001 | Briner |
| 2002/0126531 | A1 | 9/2002 | Hosono et al. |
| 2002/0172076 | A1 | 11/2002 | Marotta et al. |
| 2004/0125651 | A1 | 7/2004 | Toda |
| 2005/0169082 | A1 | 8/2005 | Cernea |
| 2005/0219905 | A1 | 10/2005 | Watanabe |
| 2006/0034122 | A1 | 2/2006 | Betster et al. |
| 2006/0140007 | A1 | 6/2006 | Cernea et al. |
| 2006/0227602 | A1 | 10/2006 | Honma et al. |
| 2007/0002631 | A1 | 1/2007 | Kang et al. |
| 2007/0035999 | A1 | 2/2007 | Kim |
| 2007/0113021 | A1 | 5/2007 | Maejima |
| 2007/0153604 | A1 | 7/2007 | Tsao et al. |
| 2007/0279990 | A1 | 12/2007 | Choy |
| 2008/0291743 | A1 | 11/2008 | Edahiro et al. |
| 2009/0168540 | A1 | 7/2009 | Nguyen et al. |
| 2009/0296488 | A1 | 12/2009 | Nguyen et al. |
| 2010/0008148 | A1 | 1/2010 | Nguyen et al. |
| 2010/0322012 | A1 | 12/2010 | Suzuki et al. |
| 2011/0051517 | A1 | 3/2011 | Mui et al. |
| 2011/0075485 | A1 | 3/2011 | Fukuda et al. |
| 2011/0188317 | A1 | 8/2011 | Mui et al. |
| 2011/0205804 | A1 | 8/2011 | Nguyen et al. |
| 2012/0069683 | A1 | 3/2012 | Kamata et al. |
| 2013/0100744 | A1 * | 4/2013 | She ..................... G11C 16/26 365/185.21 |
| 2013/0155777 | A1 | 6/2013 | Chen et al. |

FOREIGN PATENT DOCUMENTS

| | | |
|---|---|---|
| WO | 2008011439 A2 | 1/2008 |
| WO | 2011119500 A1 | 9/2011 |

OTHER PUBLICATIONS

Takeshima et al., "A 3.3 V single-power-supply 64 Mb flash memory with dynamic bit-line latch (DBL) programming scheme." Solid-State Circuits Conference, 1994. Digest of Technical Papers. 41st ISSCC., 1994 IEEE International., Feb. 16-18, 2004, pp. 148-149.

Takeuchi et al., "A dual-page programming scheme for high-speed multigigabit-scale NAND flash memories," IEEE Journal of Solid-State Circuits, vol. 36, issue 5, May 2001, pp. 744-751.

International Search Report and Written Opinion issued in International Patent Application No. PCT/US2013/047382, mailed Nov. 7, 2013, 10 pages.

Final Office Action issued in U.S. Appl. No. 13/605,424 mailed Jun. 12, 2015, 9 pages.

Non-Final Office Action issued in U.S. Appl. No. 13/605,424 mailed Jul. 30, 2014, 10 pages.

Non-Final Office action issued in U.S. Appl. No. 13/605, 424, mailed Jan. 29, 2014, 8 pages.

\* cited by examiner

Convention Programming with Alternate Program/Verify Sequence

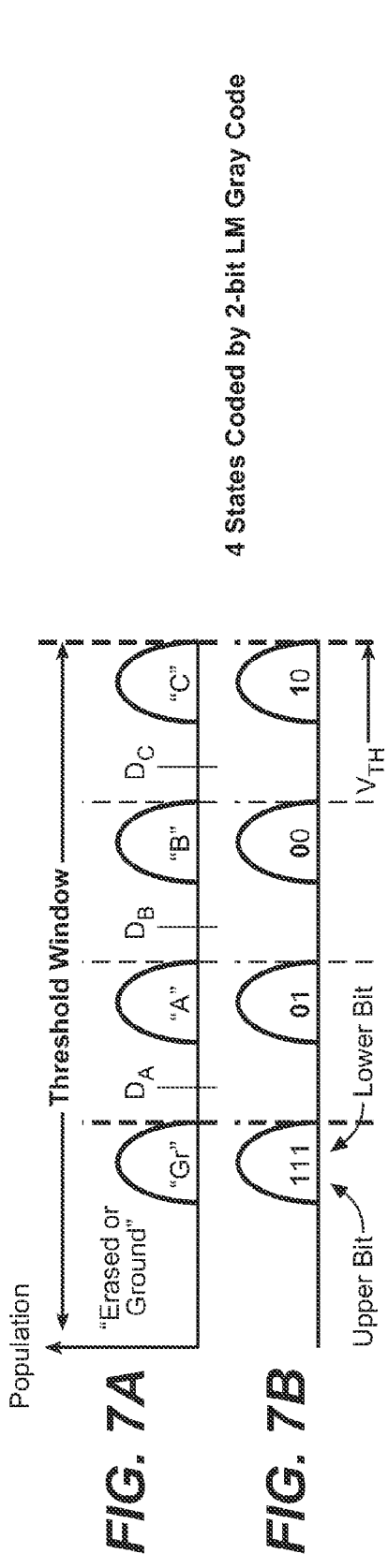
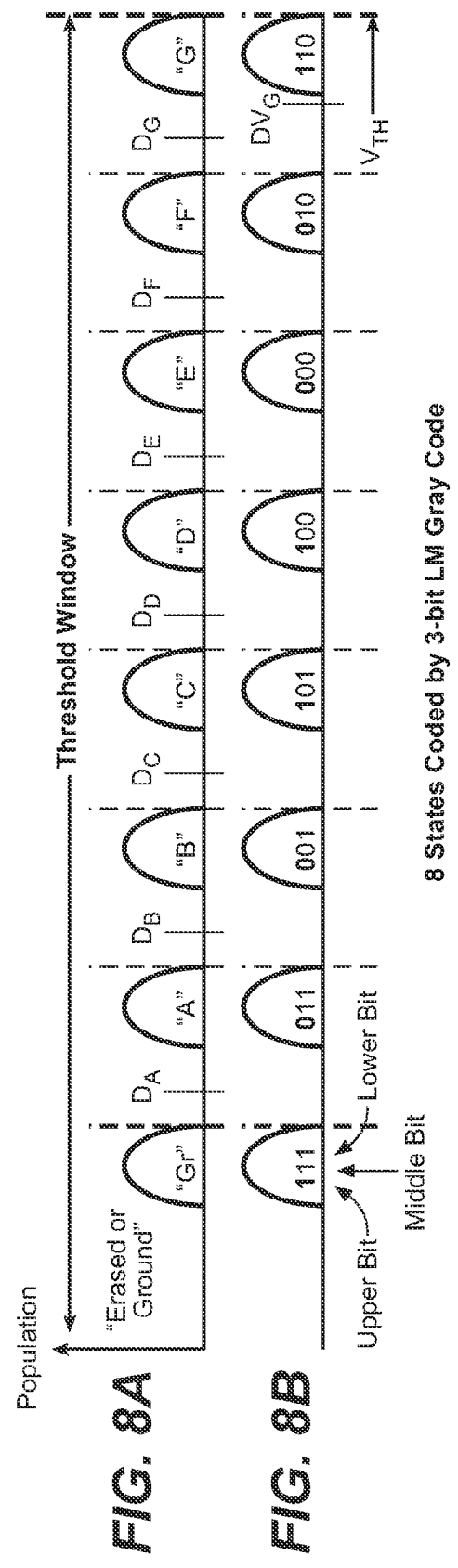

COMPACT HIGH SPEED SENSE AMPLIFIER FOR NON-VOLATILE MEMORY WITH REDUCED LAYOUT AREA AND POWER CONSUMPTION

CROSS-REFERENCE TO RELATED APPLICATIONS

This application is a Divisional of U.S. application Ser. No. 13/605,424 filed Sep. 6, 2012, which is a Continuation-in-Part of U.S. patent application Ser. No. 13/536,758, filed on Jun. 28, 2012, now abandoned, which applications are herein incorporated in their entirety by this reference.

FIELD OF THE INVENTION

This invention relates generally to non-volatile semiconductor memory such as electrically erasable programmable read-only memory (EEPROM) and flash EEPROM, and specifically to sensing circuits for such memories.

BACKGROUND OF THE INVENTION

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window (also referred to as a "conduction window"). The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In a two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768, 192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Programming a page of memory cells typically involves a series of alternating program/verify cycles. Each program cycle has the page of memory cells subject to one or more programming voltage pulses. The program cycle is followed by a verify cycle in which each cell is read back to determine if it has been programmed correctly. Those cells that have been verified will be program-inhibited from subsequent programming pulses. The program/verify cycles continue with increasing programming voltage level until all cells in the page have been program-verified.

Both reading and verifying operations are performed by executing one or more sensing cycle in which the conduction current or threshold voltage of each memory cell of the page is determined relative to a demarcation value. In general, if the memory is partitioned into n states, there will be at least n−1 sensing cycles to resolve all possible memory states. In many implementations each sensing cycle may also involve two or more passes. For example, when the memory cells are closely packed, interactions between neighboring charge storage elements become significant and some sensing techniques involve sensing memory cells on neighboring word lines in order to compensate for errors caused by these interactions.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page of contiguous memory cells. All memory elements of a page will be read or programmed together. In currently produced semiconducting integrated circuit memory chips, a memory page may have as many as 64,000 memory cells or memory elements being read or sensed in parallel.

There is an ongoing need for increased performance. Additionally, the massively parallel memory page presents significant issues of noise and interference among the closely packed memory cells and structures that limit sensing accuracy and ultimately performance and storage capacity.

Therefore there is a general need for high capacity and high performance non-volatile memory. In particular, there is a need for sensing circuits of increased speed and less noise.

SUMMARY OF INVENTION

In a first set of aspects, a sense amplifier for a memory circuit includes a latch circuit, an intermediate circuit, and bit line selection circuitry. The intermediate circuit includes a first node selectively connectable to one or more bit lines and a second node connectable to the latch circuit. The bit line selection circuitry is connected to the first node, whereby the first node can selectively be connected to one or more bit lines. The sense amplifier also includes first, second, third and fourth switches. The first switch is connected to the latch circuit and the second node, whereby a value held in the latch circuit can be connected to the second node when on and isolate the latch circuit from the second node when off. The latch circuit can be connected to a data bus by the second switch. The second node can be connected to a node of the latch that holds the inverse of said value held in the latch circuit by the third switch. The fourth switch connected between the second node and ground.

According to another set of aspects, a sense amplifier for a memory circuit includes a latch circuit and an intermediate circuit. The latch circuit is connected between a first voltage supply level and ground to hold a value latched in it. The intermediate circuit includes a first node selectively connectable to one or more bit lines, a second node connectable to a node of the latch that holds the latched value, and an internal node connectable to the first node. The sense amplifier also includes a first switch, whereby the node of the latch that holds the latched value can be connected to a data bus, and a second switch, whereby the internal node is selectively connectable to a second voltage supply level, where the first and second voltage supply levels are supplied from different on-chip supply levels.

According to further aspects, a sense amplifier for a memory circuit includes a latch circuit to hold a latched value in it, an intermediate circuit, and bit line selection circuitry. The intermediate circuit includes a first node selectively connectable to one or more bit lines, a second node connectable to the latch circuit, and an internal node connectable to the first node. The bit line selection circuitry is connected to the first node, whereby the first node can selectively be connected to one or more bit lines. The sense amplifier also includes first, second and third switches. The second node can be connected to a node of the latch that holds the latched value by the first switch. The node of the latch that holds the latched value can be connected to a data bus by the second switch. The second node can be connected to a node of the latch that holds the inverse of the latched value by the third switch. The sense amp also has a first transistor and a fourth switch connected in series between a third node and the node of the latch that holds the latched value, where the control gate of the first transistor is connected to the internal node.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 7A illustrates the threshold voltage distributions of an example 4-state memory array with an erased state as a ground state "Gr" and progressively more programmed memory states "A", "B" and "C".

FIG. 7B illustrates a preferred, 2-bit LM coding to represent the four possible memory states shown in 7A.

FIG. 8A illustrates the threshold voltage distributions of an example 8-state memory array.

FIG. 8B illustrates a preferred, 3-bit LM coding to represent the eight possible memory states shown in FIG. 8A.

DETAILED DESCRIPTION OF THE PREFERRED EMBODIMENTS

Memory System

FIG. 1 to FIG. 11 illustrate example memory systems in which the various aspects of the present invention may be implemented.

Figure 1:
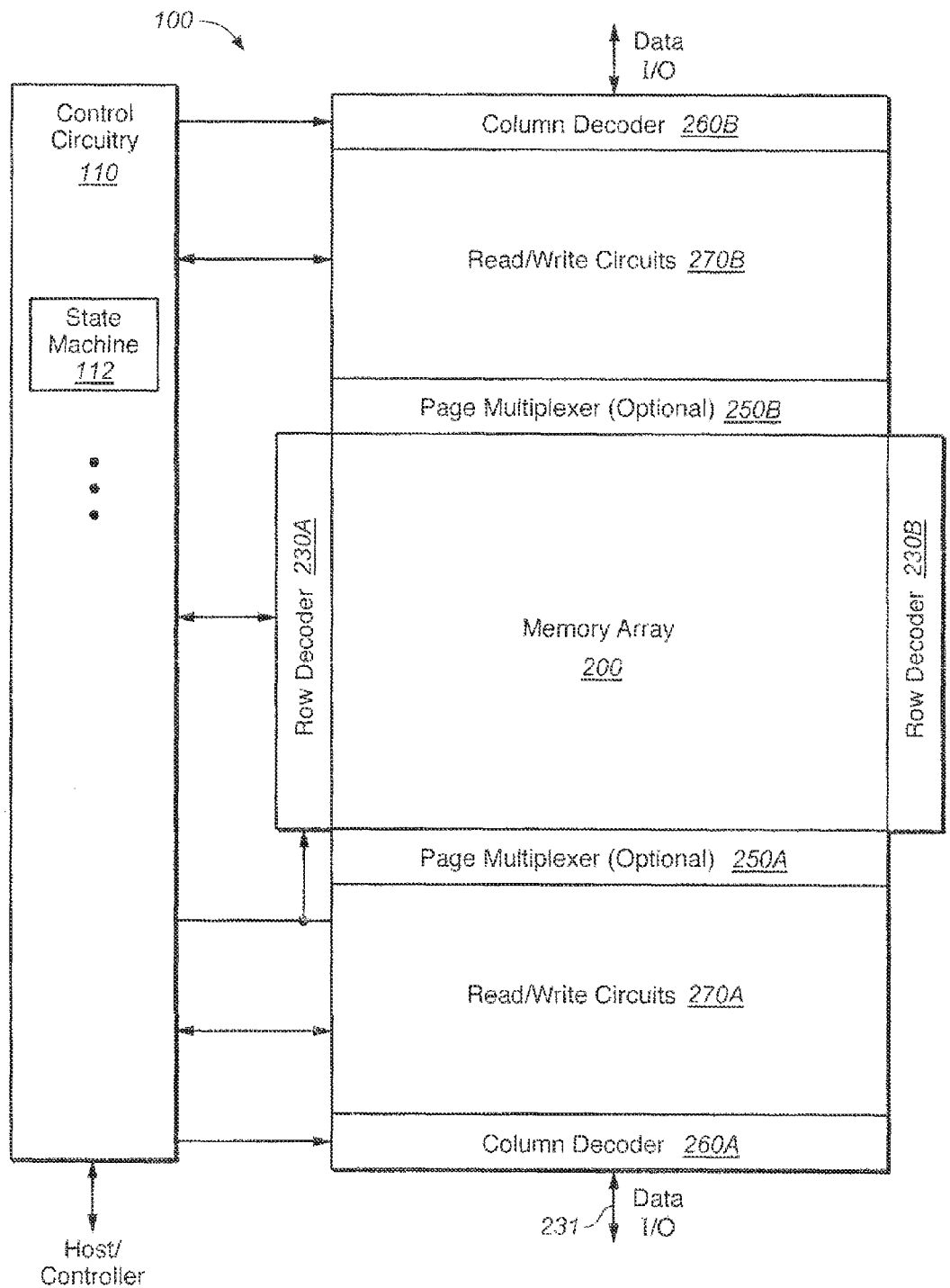
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
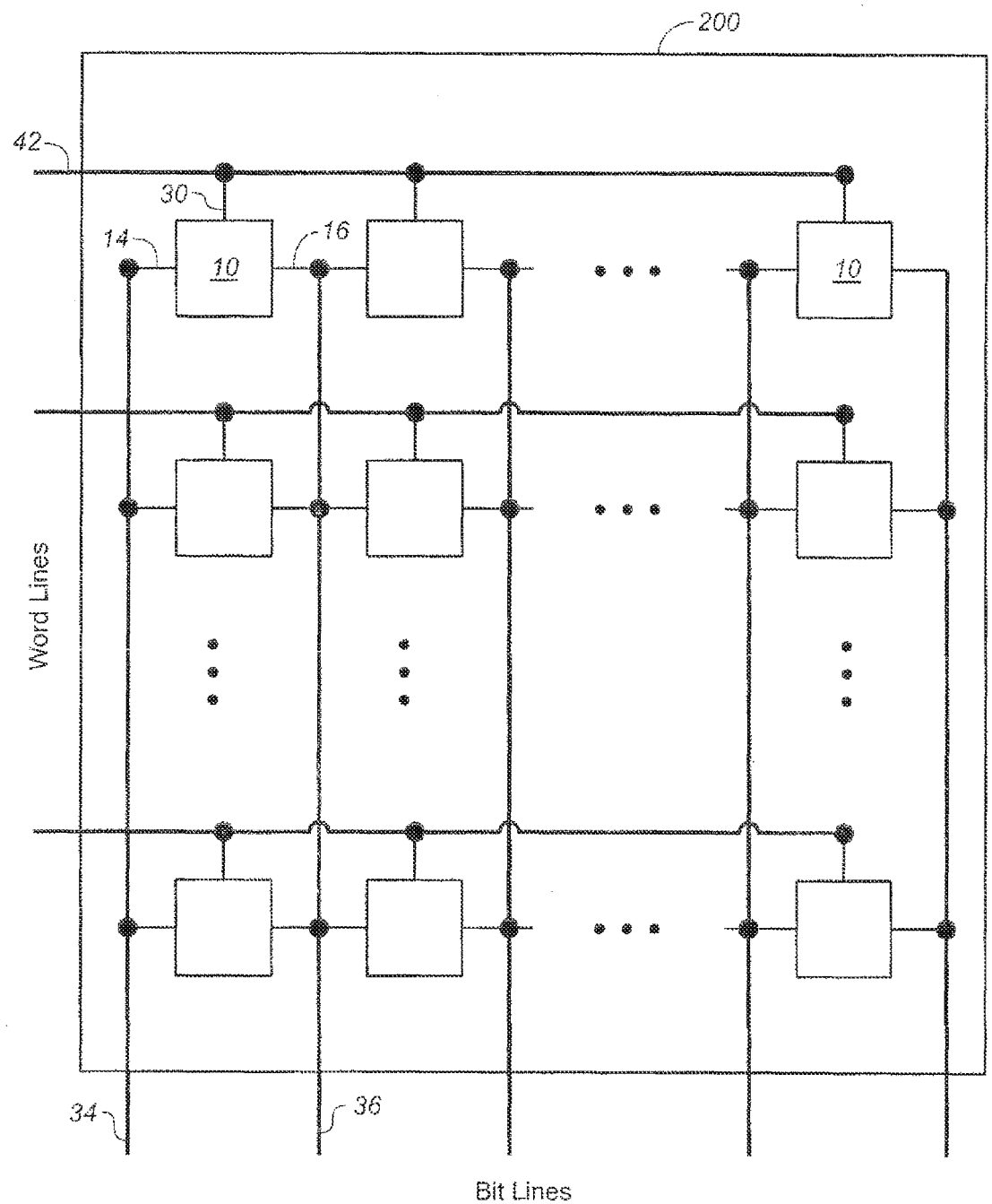
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
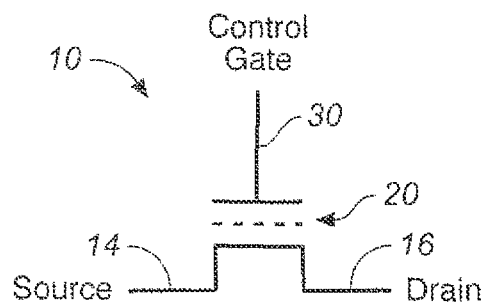
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
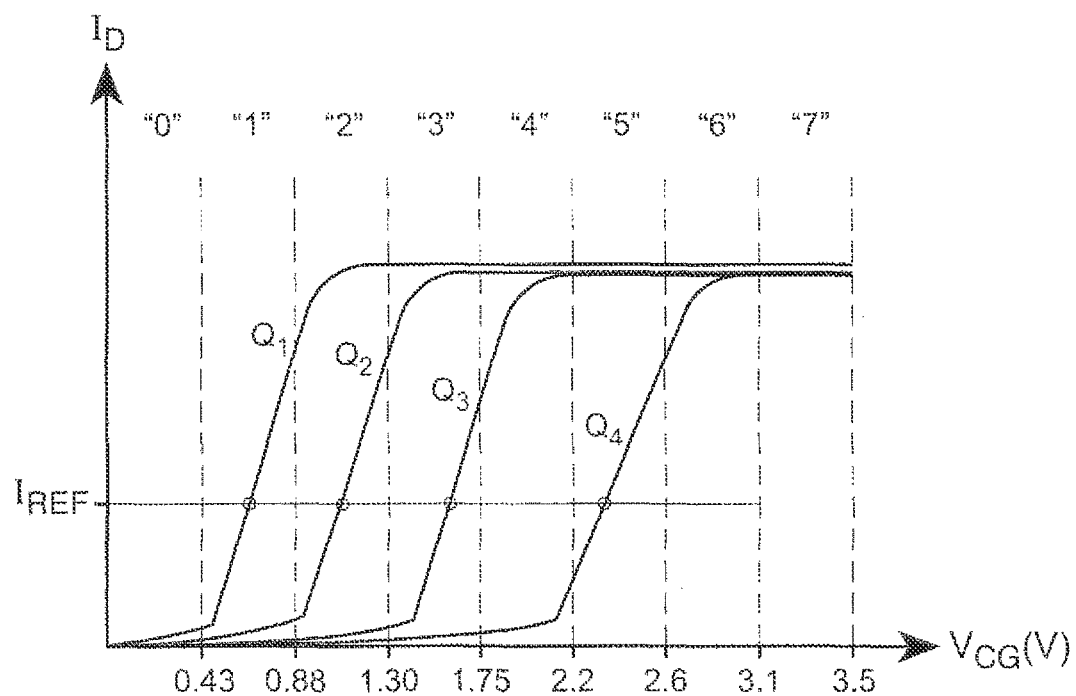
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Eight possible memory states "0", "1", "2", "3", "4", "5", "6" and "7" respectively representing one erased and seven programmed states, may be demarcated by partitioning the threshold window into eight regions in interval of about 0.4V each. For example, if a reference current, IREF of 0.05 uA is used as shown, then the cell programmed with Q1 may be considered to be in a memory state "1" since its curve intersects with $I_{REF}$ in the region of the threshold window demarcated by VCG=0.43V and 0.88V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 350 mV to 450 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
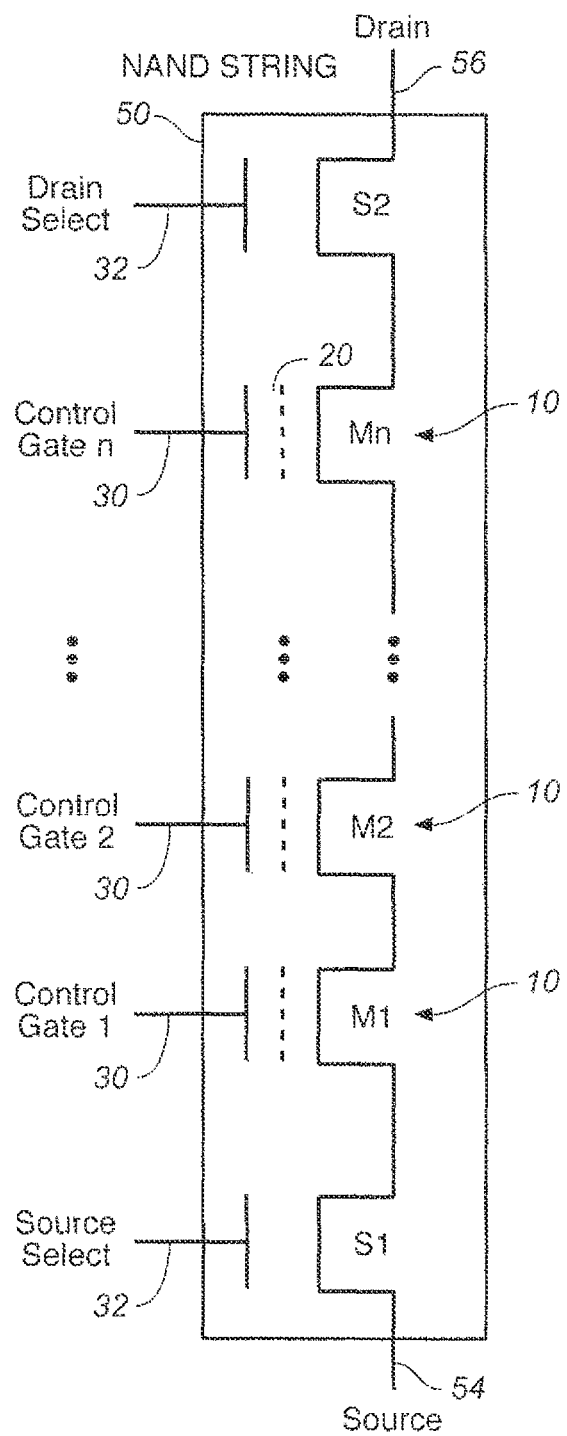
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
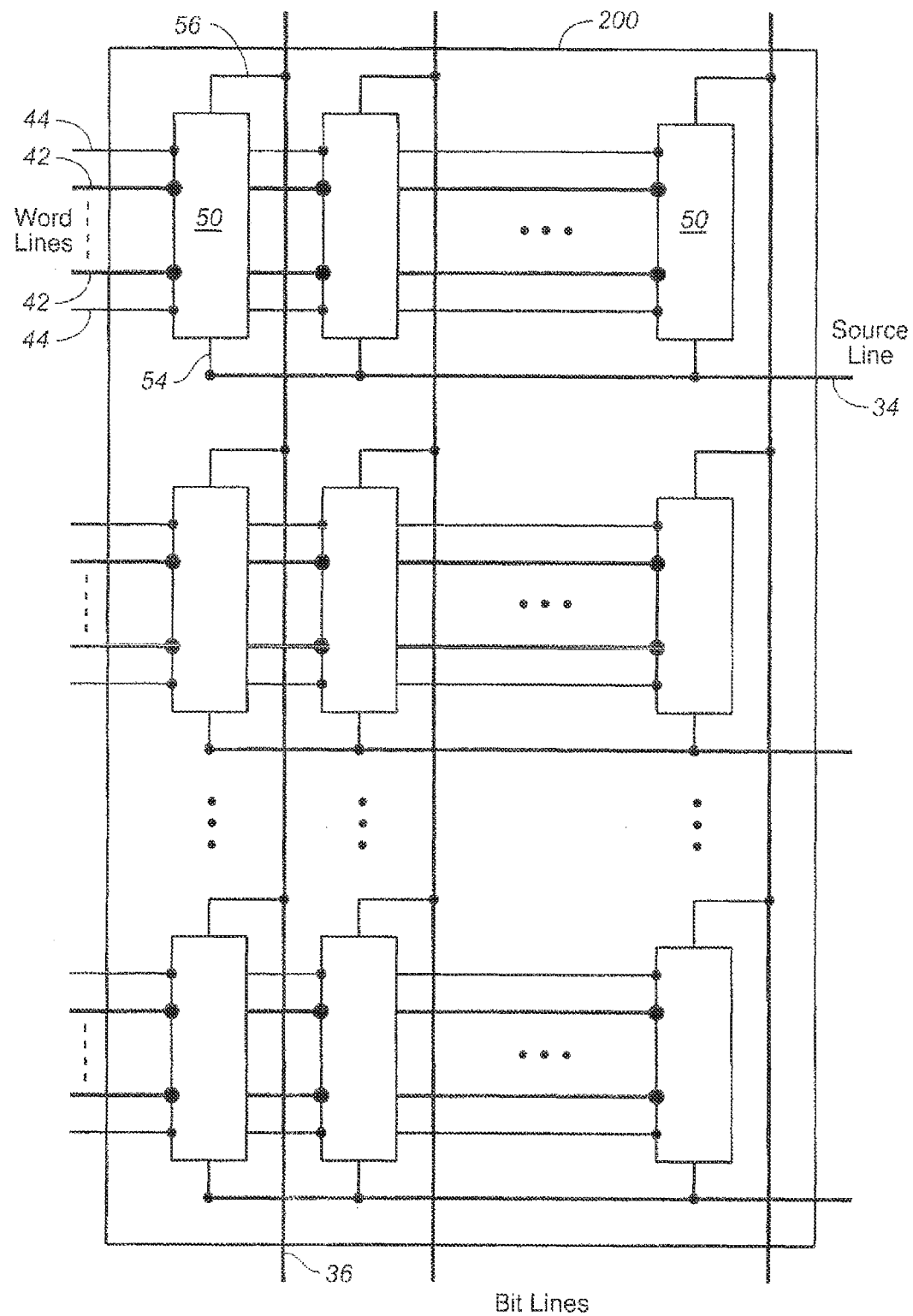
FIG. 5B illustrates an example of an NAND array of memory cells, constituted from NAND strings such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Program and Verify

Figure 6:
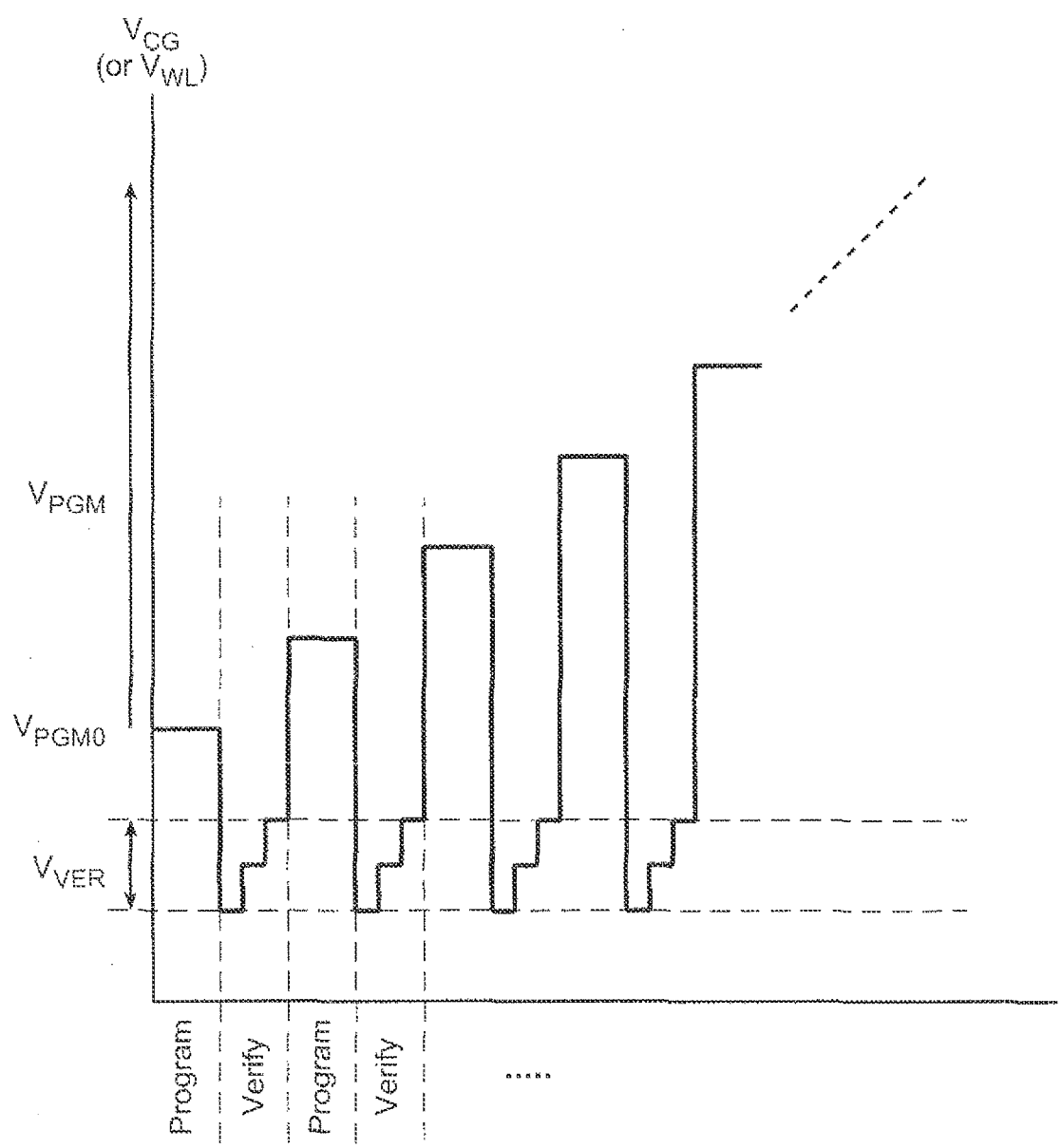
FIG. 6 illustrates a typical technique for programming a page of memory cells to a target memory state by a series of alternating program/verify cycles.

FIG. 6 illustrates a typical technique for programming a page of memory cells to a target memory state by a series of alternating program/verify cycles. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$. The cell under programming is subject to this series of programming voltage pulses, with an attempt each time to add incremental charges to the floating gate. In between programming pulses, the cell is read back or verified to determine its source-drain current relative to a breakpoint level. The read back process may involve one or more sensing operation. Programming stops for the cell when it has been verified to reach the target state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are coupled to the word line can be programmed together. Whenever a memory cell of the page has been programmed to its target state, it is program-inhibited while the other cells continue to be subject to programming until all cells of the page have been program-verified.

Examples of Memory State Partitioning

FIG. 7A illustrates the threshold voltage distributions of an example 4-state memory array with an erased state as a ground state "Gr" and progressively more programmed memory states "A", "B" and "C". During read, the four states are demarcated by three demarcation breakpoints, $D_A$-$D_C$.

FIG. 7B illustrates a preferred, 2-bit LM coding to represent the four possible memory states shown in FIG. 7A. Each of the memory states (viz., "Gr", "A", "B" and "C") is represented by a pair of "upper, lower" code bits, namely "11", "01", "00" and "10" respectively. The "LM" code has been disclosed in U.S. Pat. No. 6,657,891 and is advantageous in reducing the field-effect coupling between adjacent floating gates by avoiding program operations that require a large change in charges. The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIG. 8A illustrates the threshold voltage distributions of an example 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 8B illustrates a preferred, 3-bit LM coding to represent the eight possible memory states shown in FIG. 8A. Each of the eight memory states is represented by a triplet of "upper, middle, lower" bits, namely "111", "011", "001", "101", "100", "000", "010" and "110" respectively. The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

Sensing Circuits and Techniques

Figure 9:
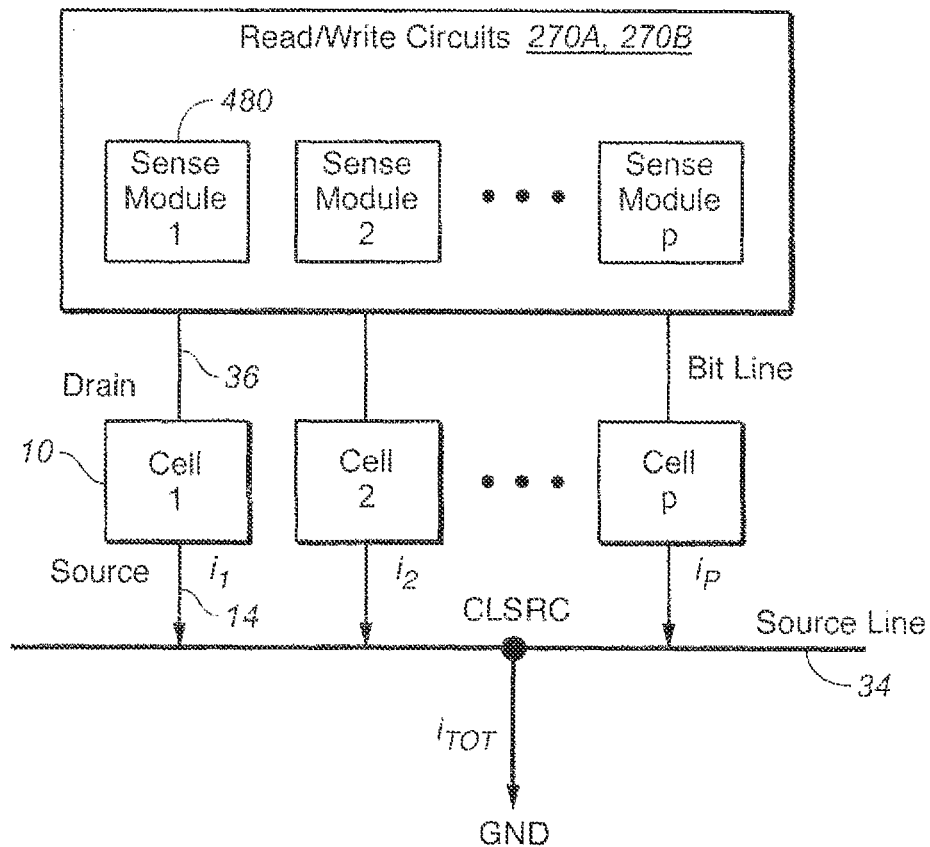
FIG. 9 illustrates the Read/Write Circuits, shown in FIG. 1, containing a bank of sense modules across an array of memory cells.

FIG. 9 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, ..., sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 10:
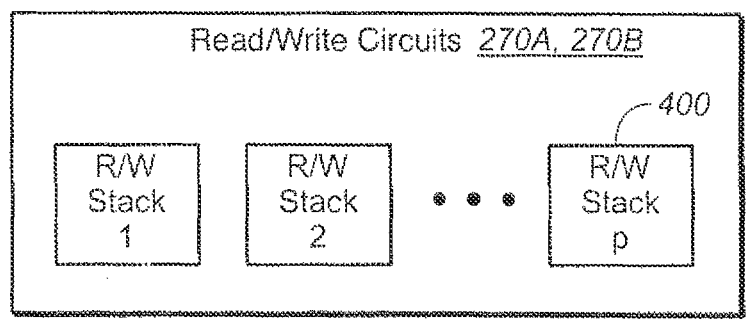
FIG. 10 illustrates schematically a preferred organization of the sense modules shown in FIG. 9.

FIG. 10 illustrates schematically a preferred organization of the sense modules shown in FIG. 9. The read/write circuits 270A and 270B containing p sense modules are grouped into a bank of read/write stacks 400.

Figure 11:
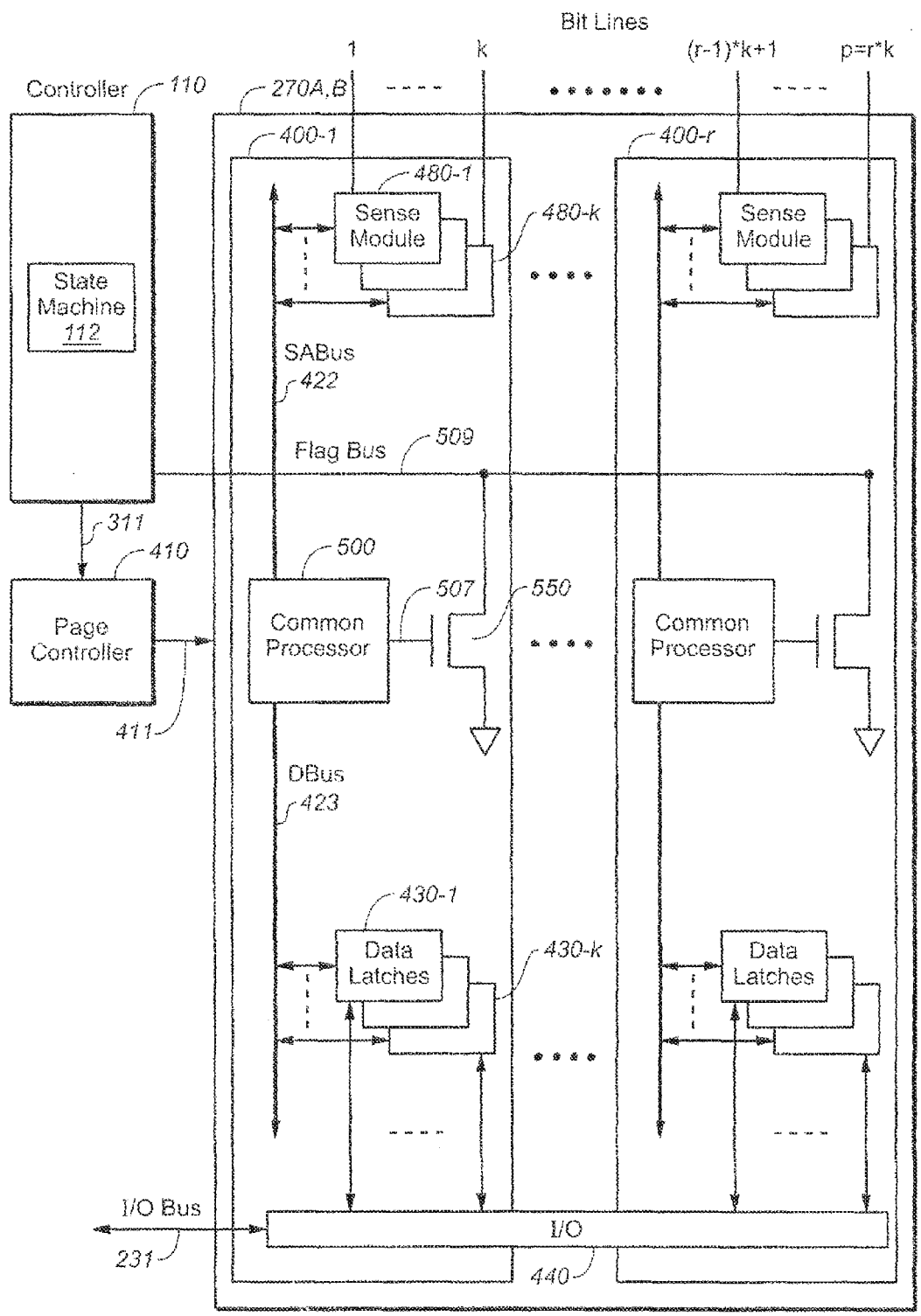
FIG. 11 illustrates in more detail the read/write stacks shown in FIG. 10.

FIG. 11 illustrates in more detail the read/write stacks shown in FIG. 10. Each read/write stack 400 operates on a group of k bit lines in parallel. If a page has p=r*k bit lines, there will be r read/write stacks, 400-1, ..., 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number:

US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably pre-charged by the controller 310 and will be pulled down when a status signal is asserted by any of the read/write stacks.

With respect to the sense modules 480, a number of arrangements are possible, with the next section presenting one particular set of embodiments in detail. In addition, various embodiments for sense modules that can be profitably incorporated into the arrangements given above are developed in U.S. Pat. Nos. 7,593,265 and 7,957,197. Reference is also made to U.S. Pat. No. 7,046,568, which discloses a non-volatile memory device with low noise sensing circuits capable of operating at a low supply voltage; U.S. Pat. No. 7,173,854, which discloses a method of referencing the word line voltage close to the source of each memory cell in a page so as to alleviate the problem of source bias error due to the ground loop; and U.S. Pat. No. 7,447,079, which discloses a memory device and method for regulating the source of each memory cell along a page to a predetermined page source voltage.

Compact Sense Amplifiers

Figure 12:
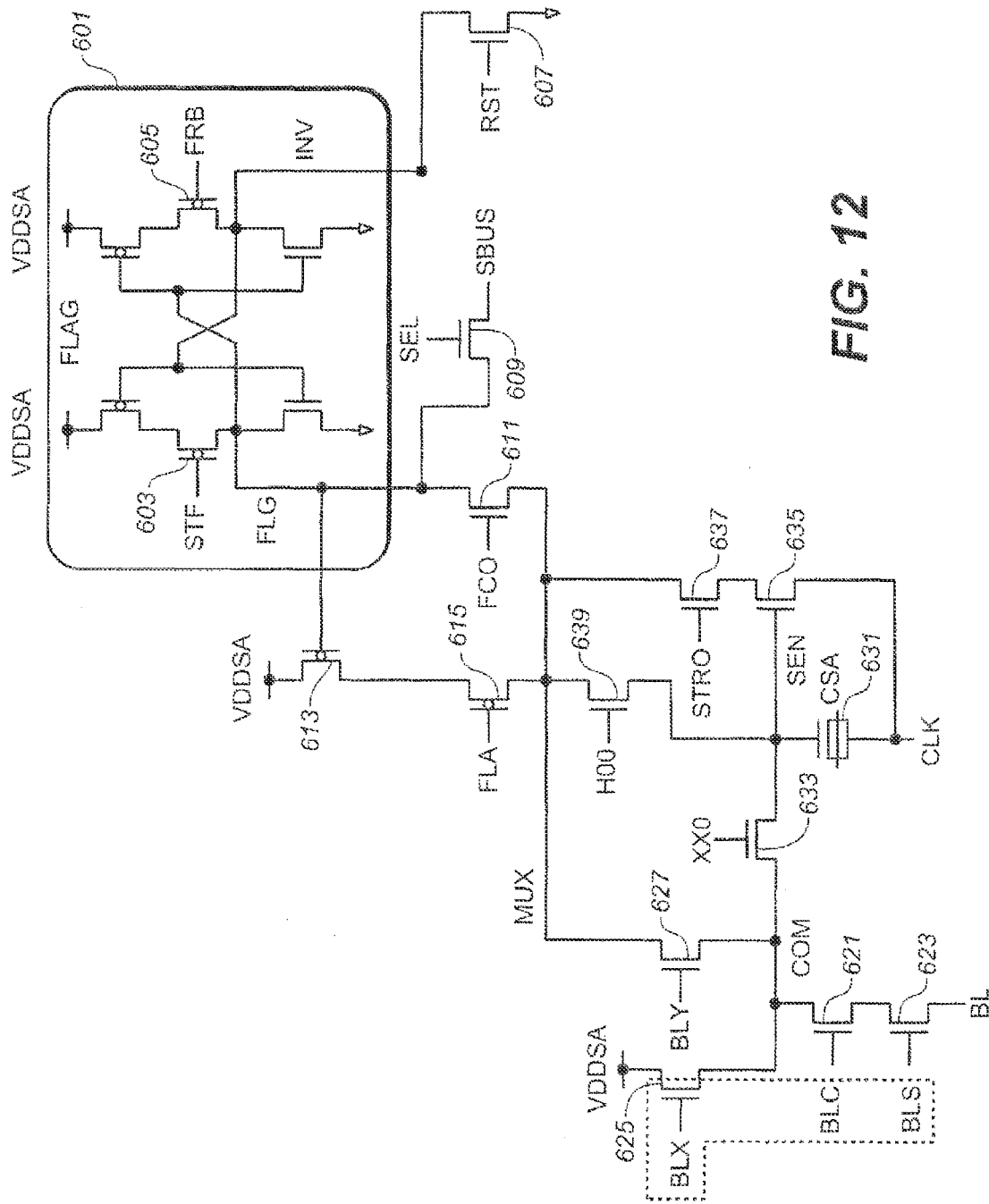
FIG. 12 illustrates schematically an exemplary embodiment for sense amplifier circuit.

This section considers a particular arrangement for the sense modules 480-i for use in the read/write circuitry presented in the preceding sections. FIG. 12 is a representation of such a compact and versatile sense amp, with various aspects of its operation being illustrated with respect to FIGS. 13-18. As will be discussed, among its other features this sense amp arrangement provides a way to pre-charge bit lines while doing data scanning Another feature is that the sense amp circuit can provide a way to set three different bit line levels used in the quick pass write (QPW) technique using dynamic latch, where quick pass write is a technique where cells along a given word line selected for programming can be enabled, inhibited, or partially inhibited for programming. (For more discussion of the quick pass write concept, see U.S. Pat. No. 7,345,928.) Also, it can provide a convenient way to measure the cell current.

Considering FIG. 12 in more detail, this shows the sense amp circuit which can be connected to a bit line at BL (lower left, below the bit line selection switch BLS 623) and to bus at SBUS (to the left of SEL 609 below the element FLAG 601). The input signal CLK is received (lower middle) can be supplied at the lower plate of the capacitor CSA 631. The sense amplifier is then also connected to a high voltage supply level (VDDSA) and ground.

A latch circuit FLAG 601 has a first leg with node FLG and a second leg with node INV, where these legs each have their node cross-coupled to the gates of a pair of series connected transistors in the other leg. The first and second legs also each include a switch formed by a PMOS respectively controlled by STF for 603 and FRB for 605, whereby each the legs can by such off above the node. The level on the node FLG can then be connected to the bus at SBUS through the switch 609 with control signal SEL. The latch can be reset through the signal RST at 607, allow INV to be set to ground.

The bit line BL can be selectively connected to the node COM by use of the bit line selection switch BLS 623 and bit line clamp BLC 621. The node COM can also be directly connected to the high supply level by the switch BLX 625. In between the bit line selection circuitry and the latch FLAG 601 is the intermediate circuitry of the sense amp. In addition to the node COM is a node MUX that is connectable to the COM node by use of the switch BLY 627. The node MUX can also be connected to the high supply level by use of the PMOS 615 controller by FLA, dependent upon the level on FLG as this is connected to the gate of PMOS 613 connected in series with FLA 615 between MUX and VDDSA.

The internal node SEN can be connected to, or isolated from, the MUX node by the H00 device 639 and the COM node by the XX0 device 633. The top place of the capacitor CSA 631 is also connected to the internal SEN node of the sense amp. In addition to being connected to the bottom plate of CSA 631, the CLK signal is also connected to the MUX node by way of the transistor 635, whose gate is connected to the SEN node, connected in series with the independently controllable device STRO 637. The switch FCO 611 allows the node MUX to be connected to, or isolated from, the level on the FLG node of the latch 601.

The arrangement of the elements in FIG. 12 has a number of useful properties, including the ability to pre-charge a bit line concurrently with a data transfer. During the bit line pre-charge through the bit line select switches, the MUX node needs to stay at the power supply voltage level. During data scanning (or called data transfer), the data information from the FLG node needs to be sent to the SBUS node. Consequently, the SBUS node toggles. Because the device FCO 611 can isolate the MUX node from the SBUS node, the MUX node will not be disturbed during the data transfer. In this way, a bit line can be pre-charged at the same time as data transfer happens. Hence, the memory circuit's performance can be improved by being able to do both of these operations at the same time.

Another useful property of the arrangement of FIG. 12 is that it allows for the three bit line values (allow, inhibit, partial inhibit) of the quick pass write (QPW) to be forced using a dynamic latch arrangement. During such a "3 BL QPW", for the inhibited bit line case the MUX node can be firmly held at a VDDSA level during the scanning in operation. The arrangement of switches prevents the SEN node from leaking, so the SEN node's voltage can be maintained. The CLK node supplies voltage to the inhibited bit lines. The SEN node of the inhibited bit line pre-charges to a high level, passing the CLK voltage level to the inhibited BL through the CLK-SEN-STRO-BLY-BLC-BLS path.

The arrangement of FIG. 12 also allows for an easy cell current measurement. A selected bit line's voltage can be supplied from an external pad of the chip through the SBUS-SEL-FLG-FCO-MUX-BLY-COM-BLC-BLS path. This means that the corresponding FLG node needs to be at an analog voltage level: besides turning off the STF device, the INV node is pulled down to the ground by the RST device. Biasing the RST node at a logic high level can pull and hold the INV node at ground.

Some of the different modes of operation for the sense amp of FIG. 12 are discussed with reference to FIGS. 13-18.

No-Lockout Read/Program Verify Operation

Figure 13:
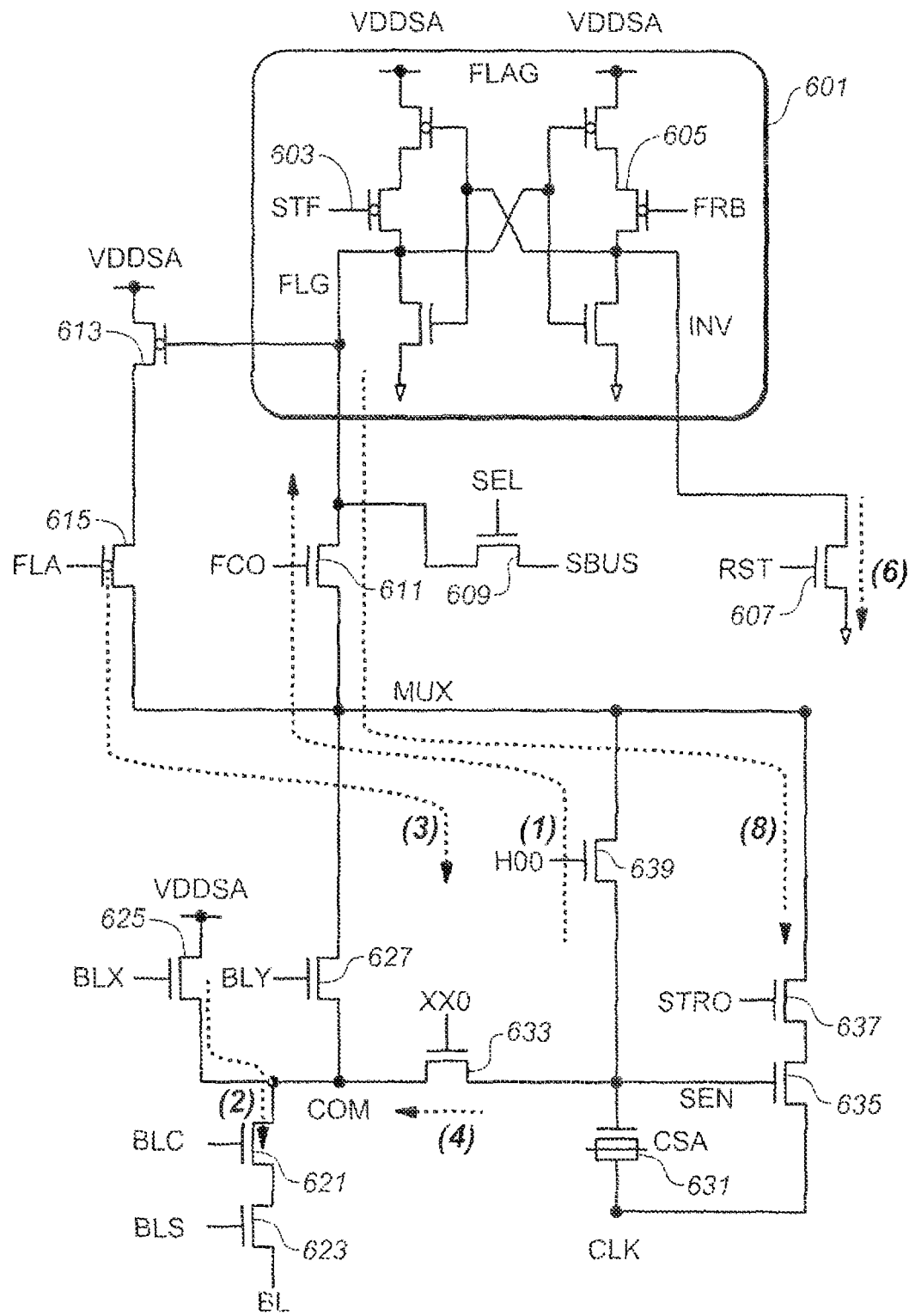
FIG. 13 illustrates an example of a sensing operation using the circuit of FIG. 12.
Figure 14:
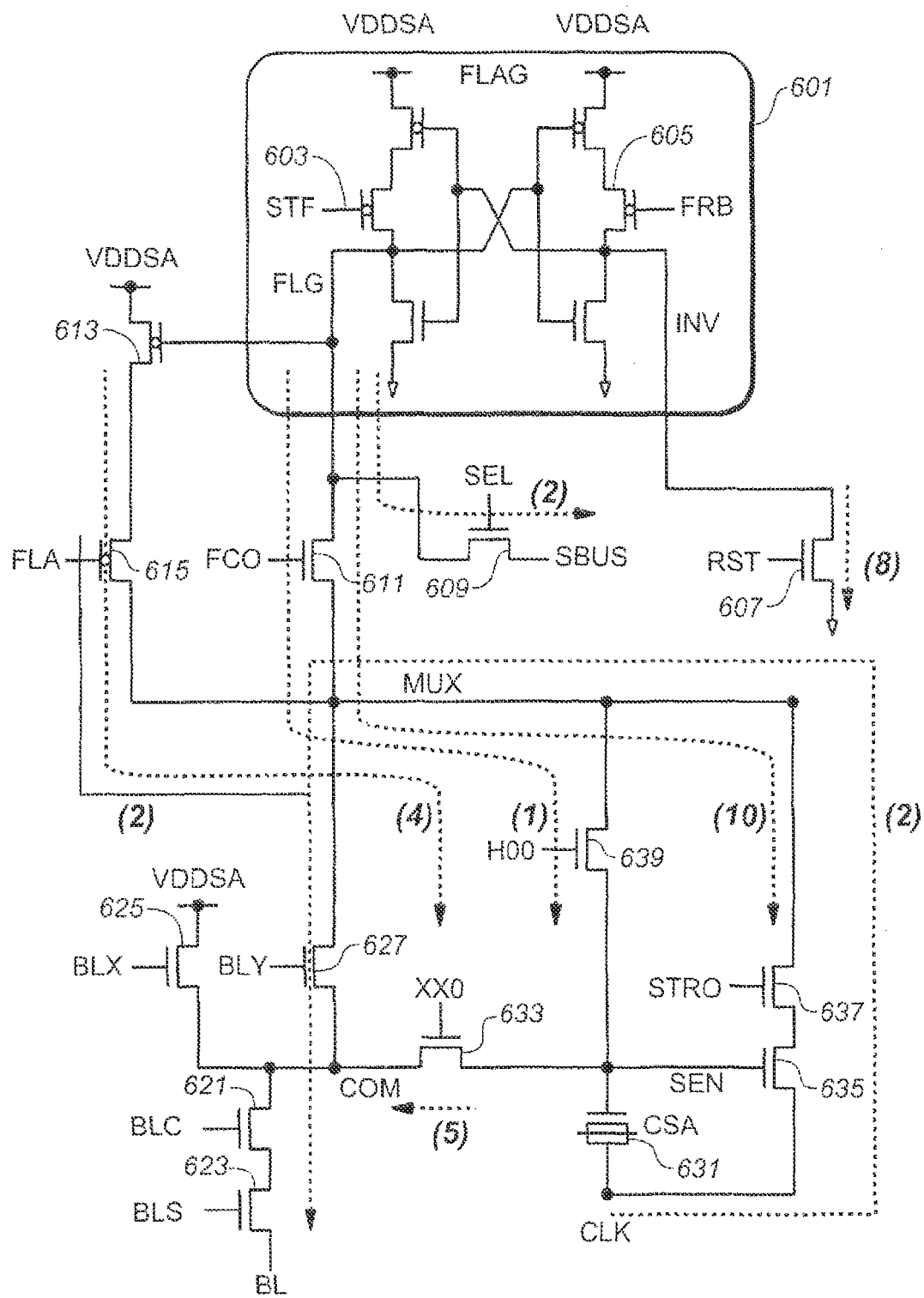
FIG. 14 illustrates an example of a lockout sensing operation using the circuit of FIG. 12.

As a first example, a no-lockout read or program verify mode of operation is illustrated with respect to FIG. 13. Initially, as illustrated by (1), the H00 639 and FCO 611 devices are turned on, discharging the SEN node through the FLG node as FLG is initially at ground. The bit line then pre-charges through the BLS 623-BLC 621-BLX 625 devices, as shown by (2). Next, as shown at (3), the SEN node pre-charges to a certain voltage level through the H00 639 and FLA 615 devices. The level at CLK then raises up and the XX0 633 device is then turned on, (4). The SEN node will then develop: If the memory cell is conductive, the SEN node will be discharged; otherwise the SEN node will not discharge much.

After the SEN node develops, the device pulls down the CLK node to ground. Next, the FRB 605 device is turned off, and the RST 607 device is turned on (at (6)) to reset the FLG node to the high VDDSA voltage level. Then the FRB 605 device is turned on and the RST 607 device is turned off. Subsequently, the FCO 611 device is turned on to pre-charge the MUX node from the FLG node. Next, the memory turns off the STF 603 device, then turns on the STRO 637 device to develop the FLG node, as shown at (8). The level previously at SEN will determine whether device 635 is on or not, in turn determining what level will develop on the FLG node. Once the FLG node finishes developing, the STRO 637 device is turned off.

Thus, the state of the selected cell along the bit line BL is used to set the value on the node SEN, from where it is transferred to the FLG node. At this point, the SEL 609 device can be turned on to transfer the value of FLG out to SBUS. Note also that once the result has been transferred from the SEN node on to the FLG node, the device FCO 611 can be used to isolate the rest of the sense amp circuitry from the latch 601, while still allowing the value latched on the FLG node to be transferred out through SEL 609. Consequently, the data latched on the FLG node can be scanned at the same time that the sense amp moves on to a next process if this does require the latch FLAG 601.

Lockout Read/Program Verify Operation

A second mode of operation is a lockout read/program verify mode. Although a somewhat more involved process than the more common no-lockout read, lockout read will draw less current as once a cell generates a positive read result (FLG high), it is removed from further sensing. Note that this is a lockout from further sensing in a series of sensing operations, as opposed to a programming lockout.

For example, in multi-state memory a sensing operation, whether for a data read, program-verify, or other reason, will often include a series of sense operation. Putting this in the context of the exemplary embodiment, a series of sense operations will include checking the memory cell's state against a number of reference parameter by, in this example, pre-charge the cell's bit line, applying a sensing voltage to the word line, and seeing if the bit line discharges through the cell. This is done for a series of increasing sensing voltages corresponding to differing states. However, if a cell conducts enough to discharge the bit line at, say, the second sensing voltage, repeating the process again at a third, higher sensing voltage will supply no additional information, but only serve to waste the current used for it and any subsequent sensings; hence, the read lockout.

During a first read cycle, the operation for the lockout is similar to no-lockout operation just discussed with respect to FIG. 13, except that where in FIG. 13 at (2) the bit line is pre-charged through the BLS-BLC-BLX path, now the BL pre-charges through the BLS-BLC-BLY-FLA path. Consequently, at the end of the first read pass, the level on the FLG node will either be VDDSA or ground, as described in the last section. The process for the second and subsequent read cycles is illustrated with respect to FIG. 14. The second pass (and any subsequent passes) again begins with the H00 639 and FCO 611 devices turning on to pass FLG's voltage (either VDDSA or ground) to the SEN node, as shown at (1).

The set of sub-processes are marked as (2), where, if negative sensing is being performed, CLK will pre-charge to a certain level (for example, this could be 0.6V to 1.7V in a practical implementation), while if positive sensing, CLK will stay at ground. At the same time, the BLY 627 and STRO 637 devices turn on to pre-charge the bit line (BL). Scanning data from FLG to external data latch (such as 430-*i*, FIG. 11) can happen at the same time (also shown as (2)). This is due to the switch FCO 611 that can isolate the FLG node from the MUX node. Note that the level on the node FLG controls the device 613 above FLA 615. If the original FLG data is low, the bit line recovers through the BLS-BLC-BLY-FLA path as 613 is on. Otherwise, the bit line is held at the CLK level through the SEN-STRO-BLY-BLC-BLS path.

After the BL recovers, the STRO 637 device is turned off, then CLK is pulled down to the ground. At (4), the SEN node is pre-charged through the H00 639-FLA 615 devices. The CLK level then raises up, after which the XX0 633 device is turned on. The SEN node will develop, as shown at (5). If the memory cell is conductive, the SEN node will be discharged; otherwise the SEN node will not discharge much. After the SEN node develops, the memory turns off the XX0 633 device, then pulls down the CLK node to ground. The BLY 627 device is turned off. The FRB 605 device is then turned off and the RST 607 device turned on to reset the FLG node to VDDSA voltage level, (8). The FRB 605 device can then be turned on and the RST 607 device turned off. The MUX node is then pre-charged from the FLG node by turning on the FCO 611 device. As shown at (10), the STF 603 device is turned off, then the STRO 637 device is turned on to develop the FLG node based on the value at SEN, which is connected to the control gate of 635. After that, memory turns off the STRO 637 device, and then turns on the STF 603 device. Once the FLG level is developed, it can then be scanned out to SBUS through SEL 609.

Quick Pass Write, Two Forced Bit Line Values

During a program operation, for cells to be programmed the bit line is biased to a low voltage (typically ground), while cells that are not to be programmed or have verified and need to be locked out from further programming have their bit line biased high. In a quick pass write (QPW) arrangement, cells that are selected for programming that are approaching their target level are partially inhibited to slow the programming process for better accuracy by raising their bit line levels to an intermediate value. These bit lines values can be set in several ways. In this section the case where two of these bit line values are forced (or "2BL forcing"), both the program enable value (0V) and the QPW partial inhibit value (~0.7V) are forced, while for the program inhibit case the bit line is left to float after being initially set high. An alternate arrangement where the high, program inhibit value is also forced (or "3BL forcing") is considered in the next section.

Figure 15:
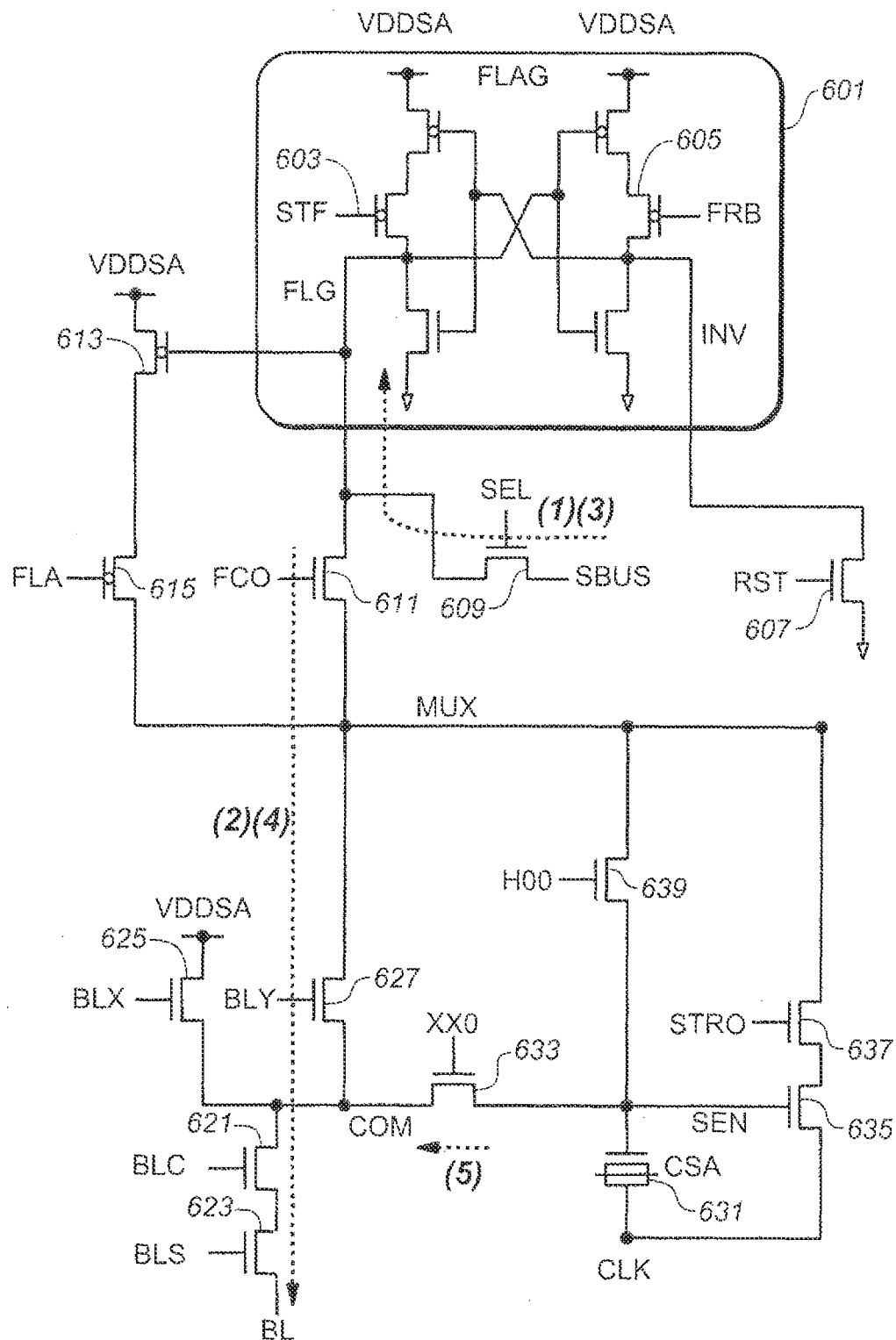
FIG. 15 illustrates an example of a quick pass write operation with two forced values using the circuit of FIG. 12.
Figure 16:
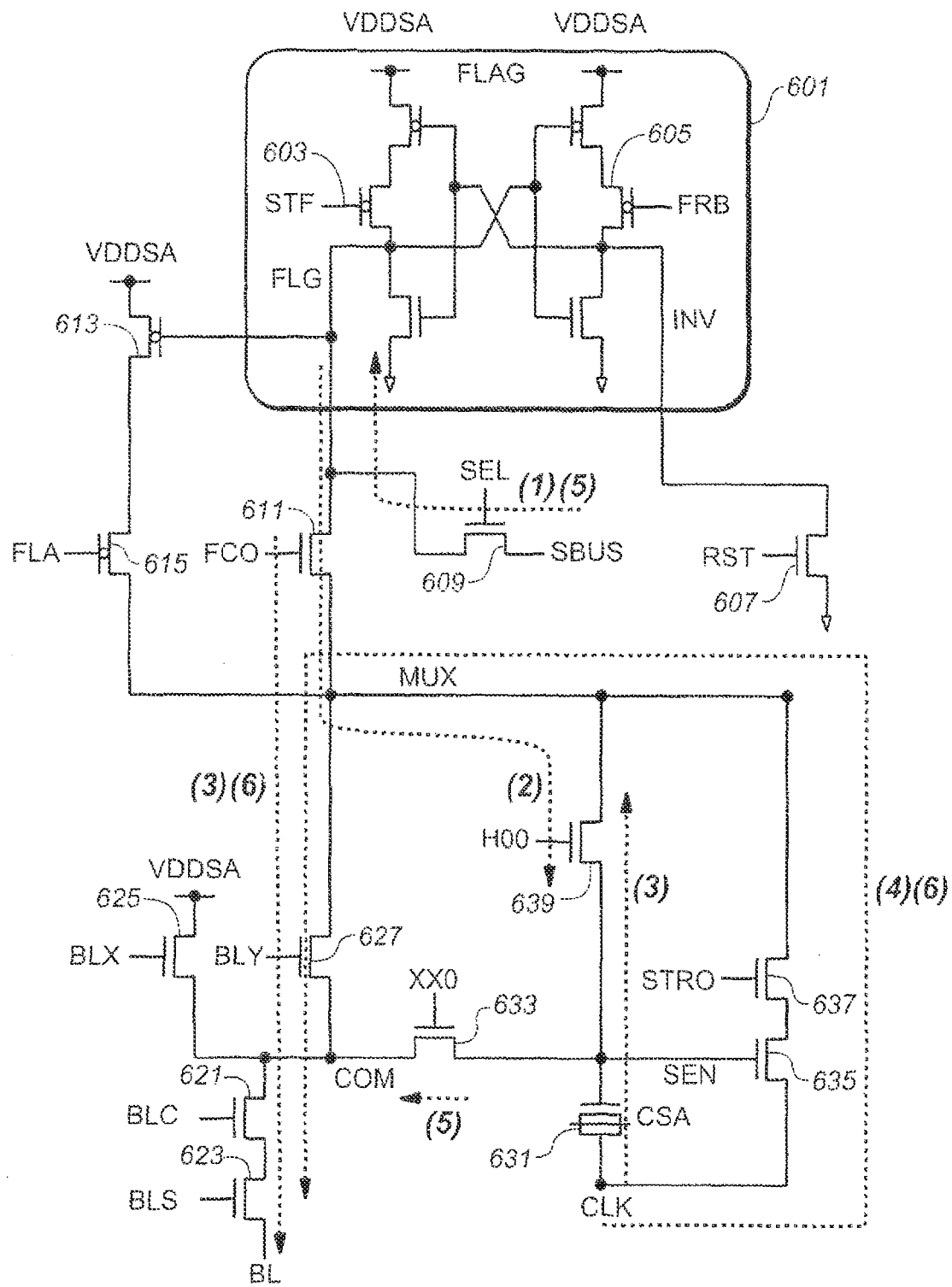
FIG. 16 illustrates an example of a quick pass write operation with three forced values using the circuit of FIG. 12.

Considering the process as shown in FIG. 15, at (1) data is set on the FLG node from the SBUS by way of the SEL device 609. If the bit line is inhibited, the corresponding FLG=VDDSA is set, while otherwise FLG=ground. The level on the FLG node then is used to set bit line value in (2): the BLS 623, BLC 621, BLY 627 and the FCO 611 node are raised to a high voltage. Then the bit line will either pre-charge to the VDDSA level or stay at ground, depending on its FLG data. At (3), the BLC 621/BLY 627/FCO 611 devices are turned off and the data is set again on the FLG node. If the bit line is inhibited/QPW, the corresponding FLG value is VDDSA, otherwise FLG=ground.

At (4), the BLC 621/BLY 627 nodes are then raised again to a high voltage. The memory will raise the FCO 611 device's gate node to a voltage level that will be used to control the QPW BL's voltage level, say ~0.7V (for a VDDSA of ~2.5V), for example, to set a level of ~0.7V on BL. The inhibited bit line will float at a level high enough to inhibit the programming. The QPW BL is pre-charged through the FCO-BLY-BLC-BLS path, the programmed BL shares the same path but biased at ground by its FLG node. Once the bit line becomes stable at the appropriate level, programming can be done.

Quick Pass Write, Three Forced Bit Line Values

As just noted, for the "2BL-forcing" arrangement, the inhibited bit line will float. This section considers a mode where the inhibit value is also forced to the high supply level in a "3BL-forcing" arrangement, allowing all three values to be set by the single latch. The process, as illustrated with respect to FIG. 16, again begins with setting data on the FLG node from the SBUS by way of SEL 609, as shown at (1). If the bit line is inhibited, the corresponding FLG=VDDSA, otherwise FLG=ground. At (2), the H00 639 and FCO 611 gate nodes are raised to a high voltage, passing FLG's voltage level to the SEN node. The H00 639 device is then turned off.

Next, as shown by the paths (3), the memory raises the BLS 623, BLC 621 and BLY 627 gate nodes to a high voltage. The FCO 611 gate node is still kept at a high level from the previous sub-operation, (2). Based on these levels, the BL node will either pre-charge to the high VDDSA level or stay at ground, depending on its FLG data. The H00 639 gate node is biased at a threshold voltage that will keep the H00 639 device weakly on for the BL that is not to be inhibited; for an inhibited BL, the H00 639 device is still off as the MUX node is at VDDSA level. At the same time CLK node is charged to the VDDSA level. The inhibited BL is then pre-charged through the FCO-BLY-BLC-BLS path. The other BLs also share this path, but held at ground by the FLG node.

After some time, the STRO 637 device is turned on. The SEN node will still be a high level for the inhibited bit line, while it is at ground for the other cases. Consequently, the device 635 will also be on for the inhibited case. Consequently, as shown by the path (4), for an inhibited BL, its MUX node is hold firmly at VDDSA by the high CLK value. Consequently, the internal node SEN is again being used as an internal dynamic latch where a voltage level can be parked.

The BLC 621/BLY 627/FCO 611 devices are then turned off and the memory again sets data on the FLG node, as shown at (5). If BL is inhibited/QPW, the corresponding FLG=VDDSA, otherwise FLG=ground. The BLC 621/BLY 627 nodes are then raised to a high voltage again. For the FCO 611 device's node, this is raised to a voltage level that will be used to control the QPW BL's voltage level. The inhibited BL is held at VDDSA level through the CLK-SEN-STRO-BLY-BLC-BLS level. The QPW BL is pre-charged through the FCO-BLY-BLC-BLS path. Both paths are marked (6). The programmed BL shares the same path, but is biased at ground by its FLG node. After the bit line is allowed stabilize, the corresponding selected word line can be programmed.

Floating Quick Pass Write

The mode discussed in this section is another variation on the quick pass write technique, a Floating Quick Pass Write (FQPW) or Nakamura operation. The ability to perform this operation for a given bit line with only a single latch using the sense amp circuit of FIG. 12 will be discussed with respect to FIG. 17. In this variation on quick pass write implementation, the bit lines are again of three groups: a first group to be inhibited; a second group to be programmed; and the third group to be slow programmed. In a first step, the first group is taken to a value offset some below the high level, VDDSA−ΔV, where the offset can be a settable parameter. For example, if VDDSA=~2.5V and ΔV is ~0.7V, this would be ~1.8V. The second group pre-charged, then left to float at 0V. The third group is set to a low value, say ~0.7V, then left to float. At the second step (see (6) below), the first group is taken to the high level, while the bit lines of groups 2 and 3 will get coupled up if the bit line is adjacent to a bit line of group 1.

Figure 17:
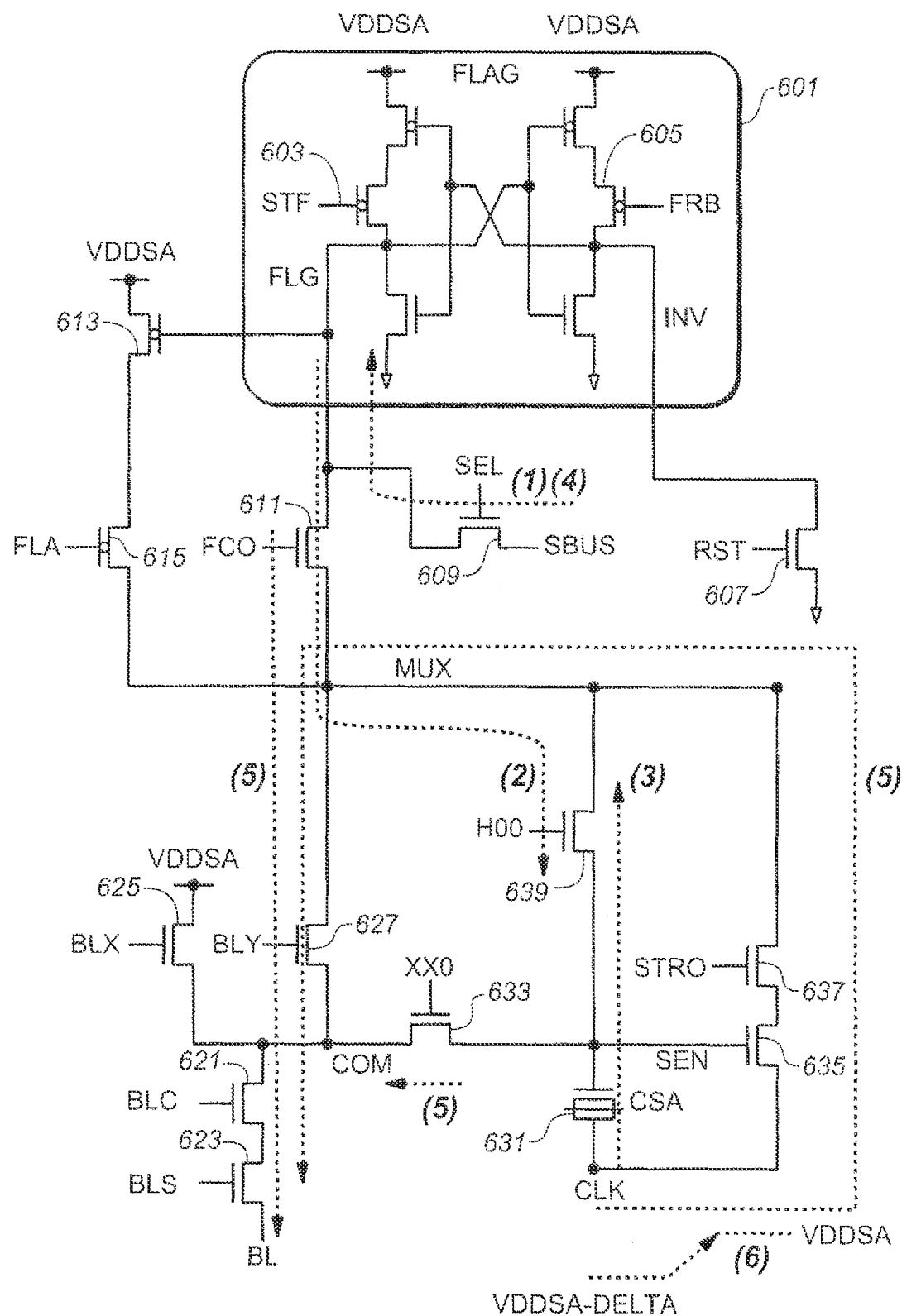
FIG. 17 illustrates an example of a floating quick pass write operation using the circuit of FIG. 12.
Figure 18:
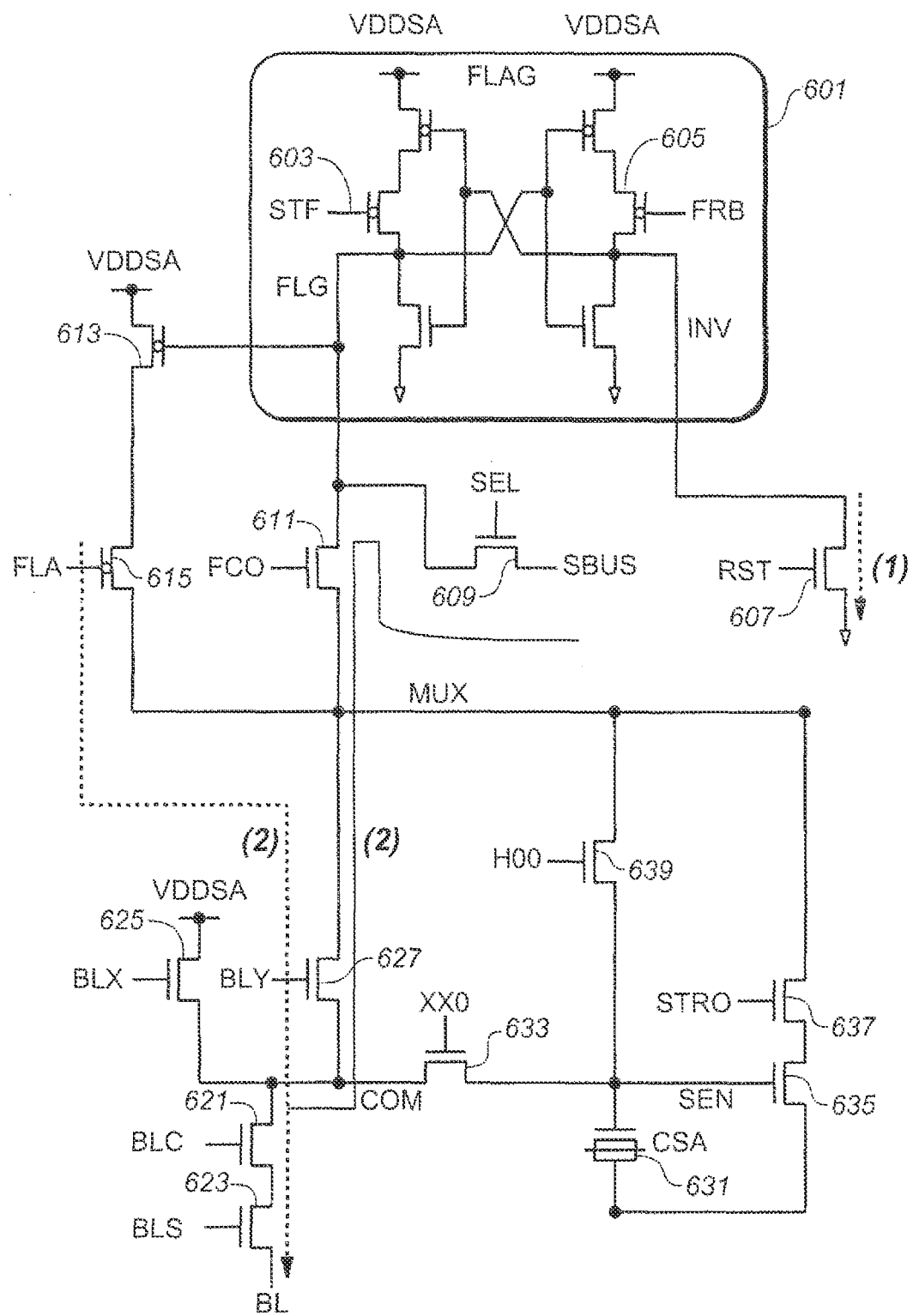
FIG. 18 illustrates an example of measuring cell current using an external bias voltage using the circuit of FIG. 12.

Referring now to FIG. 17, as shown at (1), the memory sets data on the FLG node: If BL is inhibited, the corresponding FLG value is VDDSA, otherwise FLG=ground. Next, as shown at (2), the H00 639 and FCO 611 nodes are raised to a high voltage to pass the FLG's voltage level to the SEN node. The BLS 623 device could turn on at this time. At (3), the H00 639 node's voltage is lowered to make it barely above a threshold voltage to keep H00 639 NMOS weakly on for the BL that is not inhibited; for an inhibited BL, the H00 639 device is still off since the MUX node is at VDDSA level. The CLK node is raised to a level lower than VDDSA by a certain amount (VDDSA−DELTA), corresponding to the group 1, step 1 described in the last paragraph. After some time, the memory turns off the H00 639 and FCO 611 devices completely. Note that at this point that the SEN node for inhibited BL case will be at a very high level, while it is at ground for other BL cases.

Once the BLC 621/BLY 627/FCO 611 devices are off, the memory again sets data on the FLG node at (4). If the BL is inhibited/QPW, the corresponding FLG level is VDDSA, otherwise FLG=ground. Once data is again set, the BLC 621/BLY 627/STRO 637 nodes are raised to a high voltage. The memory will raise the FCO 615 device's gate node to a voltage level that will be used to control the QPW BL's voltage level. The inhibited BL is charged through the CLK-SEN-STRO-BLY-BLC-BLS path, while. the QPW BL is pre-charged through the FCO-BLY-BLC-BLS path, and the programmed BL shares the same path but biased at ground by its FLG node. These paths are shown at (5). After some time, the memory turns off the FCO 611 device and raises CLK to the VDDSA level, as shown at (6). After the bit line stabilizes, the corresponding word line can be programmed.

Measurement of Cell Current Using External Bias Voltage

A final example is a mode allowing a cell's current to be measured using an external bias voltage. This is illustrated with respect to FIG. 18. Referring back to FIG. 12 first, the arrangement of the FLAG reset switch RST 607 allows for the INV node to be held to ground. By placing an external voltage onto a pad of the memory chip that can be connected to the SBUS node, this allows the amount of current drawn by the bit line to be measured. This can be used, for example, as part of a test mode to analyze device characteristics. When measuring the cell current, for example, half of the bit lines could be selected, the other half unselected. (In the following, it is assumed that the unselected BLs are also biased.)

For the selected BLs, the RST 607 device is always on to pull its INV node to the ground as shown at (1), its STF 603/FLA 615 devices are off, and its FCO 611 device is on. For an unselected BL, its RST 607 device is off, while its STF 603/FLA 615 device is on, its FCO 611 device is off. For the unselected BL, its FLG node is initialized to be at ground. Note that at this point that the FLG node of the selected BL is not controlled by the FLAG latch anymore, which is now floating at this point.

Next, the SEL/BLY 627/BLC 621/BLS 623 devices are turned on. BLY 627 and BLS 623 are at a high voltage. For a selected BL, its BLC 621 node is at a very high voltage to pass the bias voltage from the external pin to the BL through the SBUS-SEL-FCO-BLY-BLC-BLS path. For the unselected BL, its BLC 621 node is biased at a level to control the BL's voltage, the unselected BL are pre-charged through the FLA-BLY-BLC-BLS path. These are both shown at (2). The amount of current being drawn can then be measured.

Second Embodiment

The preceding discussion, which are developed further in U.S. patent application Ser. Nos. 13/277,915 and 13/277,966, was based on the circuit of FIG. 12. This section presents another embodiment, shown FIG. 19, which a variation of the circuit of FIG. 12 and is numbered similarly (i.e., 701 of FIG. 19 corresponds to 601 of FIG. 12).

Figure 19:
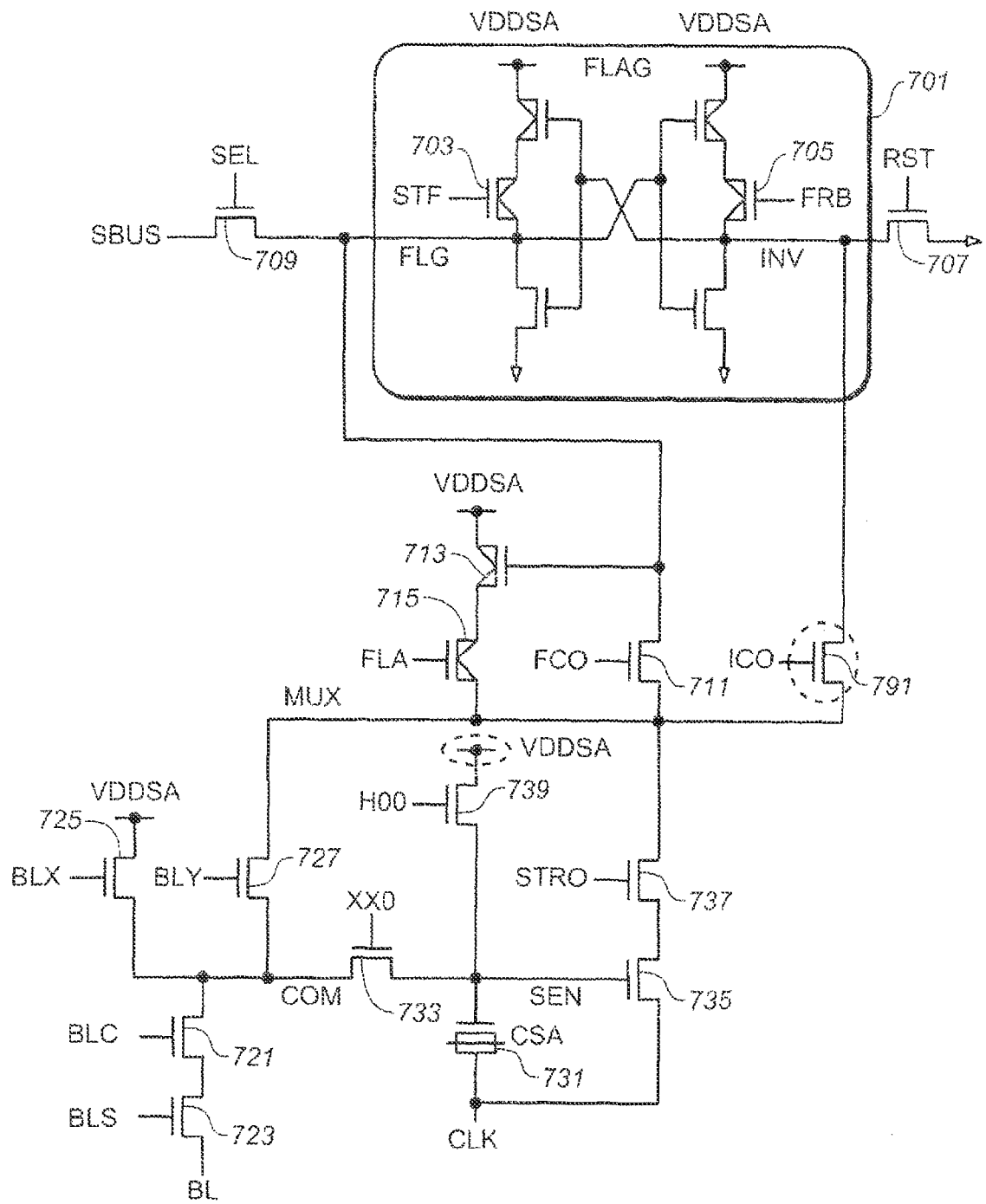
FIG. 19 illustrates schematically a second exemplary embodiment for sense amplifier circuit.

Relative to the circuit of FIG. 12, the embodiment of FIG. 19 now includes the transistor ICO 791 connected between the INV node of the latch 701 and the MUX node. This can remove the need for a dynamic latch operation. INV has the polarity of the program or verify operation and, as discussed below, during binary (SLC) programming, ICO 791 can pass the VDDSA level to the bit line BL for erase or verify pass of a selected cell along the bit line and pass VSS to BL for programming of the cell.

The circuit of FIG. 19 also differs from that of FIG. 12 in that the drain side of H00 739 is now connected to high voltage level rather than MUX, so that the SEN precharge is no longer related to FLG. As will be discussed below, this allows the XX0 733 assist to be done at the same time SEN is precharged. In addition, FLG can be reset to VDDSA in parallel with SEN precharging. With these modification, the programming time for both SLC and MLC operations can be improved by several percent.

Figure 20A:
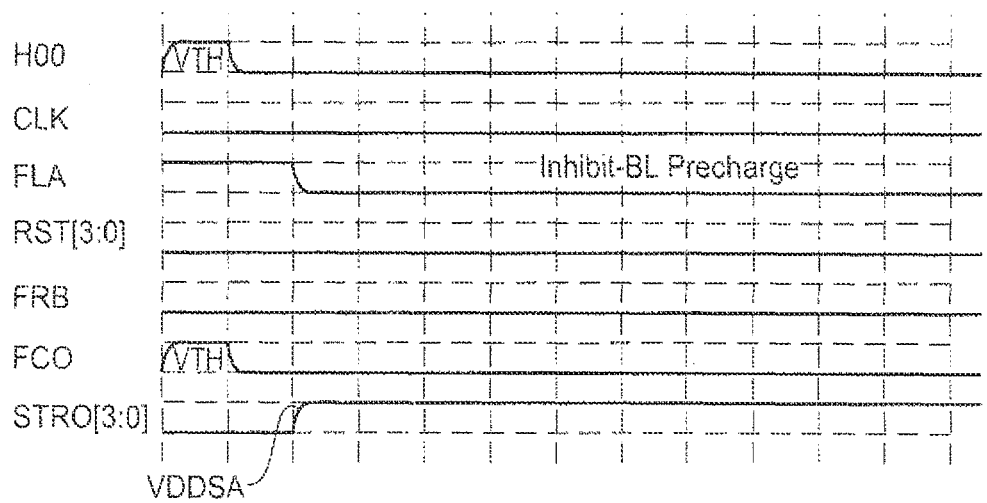
FIGS. 20A and 20B are respective waveforms for a binary program operation for the circuits of FIGS. 12 and 19.
Figure 20B:
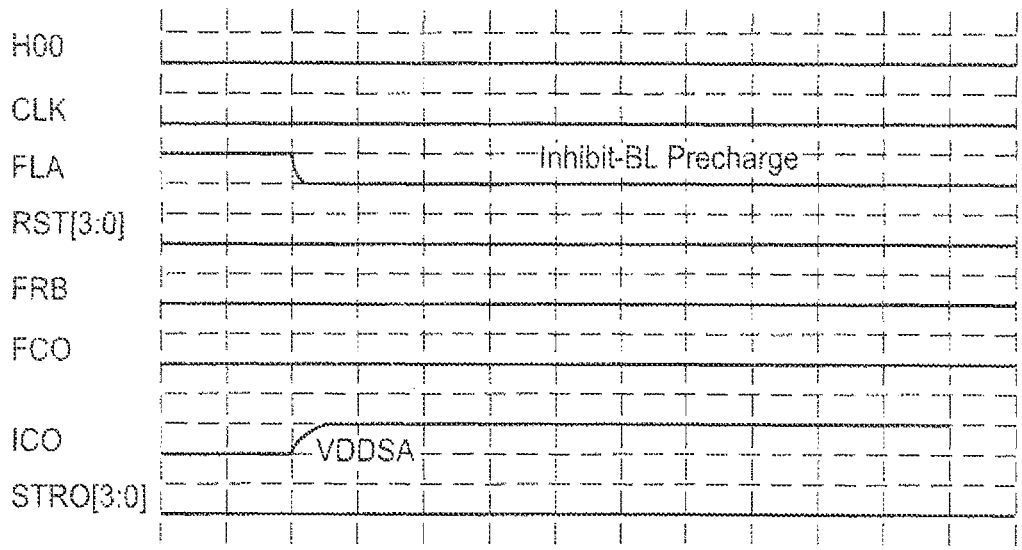

The operation of the circuit of FIG. 19 during a binary, or SLC, program operation can be illustrated with respect to FIGS. 20A and 20B, where FIG. 20A shows the operation for the circuit of FIG. 12 and FIG. 20B shows the same case for FIG. 19. Considering the case of a "Fast SLC" program operation, the FLG value in 601 or 701 is not reset by transferring data between it and the latches outside of the sense amp in order to thereby speed up programming and the sense amp can keep the original program data with adding additional latch. Before the first program pulse, the memory transfers in the data into the sense amp. As discussed in more detail above, for a program cell FLG=VDD and for the erase cell FLG=VDD. During verify, FLG is flip from VDD to VSS though the STRO 637 and SEN 635 path (CLK=VSS during strobe) for the cell that passes verify.

For the circuit of FIG. 12, in order to inhibit the cell from programming, the circuit biases the bit line BL to the VDD level for preparing boosting at the later stages. Since FLG=VSS for the erase cell or verify pass cell, the FLA 615 path is used to pass VDDSA. When the memory is to program the cell, it will keep the BL to VSS level. In order to do so, the FLG level is first transferred to the SEN node (SEN=VDD for the program cell, and VSS for the erase or verify pass cell), and then the STRO 637 path is used to discharge BL to VSS (CLK=VSS). FIG. 20A is the timing diagram of this operation: initially H00 and FCO are taken high to pass the value to set the value on SEN, after which the STRO value goes high. (See discussion in preceeding sections for more detail.)

To speed up this operation, the embodiment of the circuit of FIG. 19 adds the transistor ICO 791 to provide a path between the INV node of the latch circuit FLAG 701 and the MUX node. This allows the memory to skip the "dynamic latch" operation (that is, remove FLG to SEN transfer) of the circuit of FIG. 12 at the beginning of FIG. 20A, thereby speeding up the operation. The corresponding operation of FIG. 19 is illustrated by the waveforms of FIG. 20B. In contrast to FIG. 20A, in FIG. 20B both the H00 and FCO levels stay low, thereby saving the time to raise these values, perform the FLG to SEN transfer, and take these values back down. In FIG. 20B, the STRO value also can stay low as the SEN value no longer needs to be sifted to the BL, as this can be done by the ICO path.

Figure 21A:
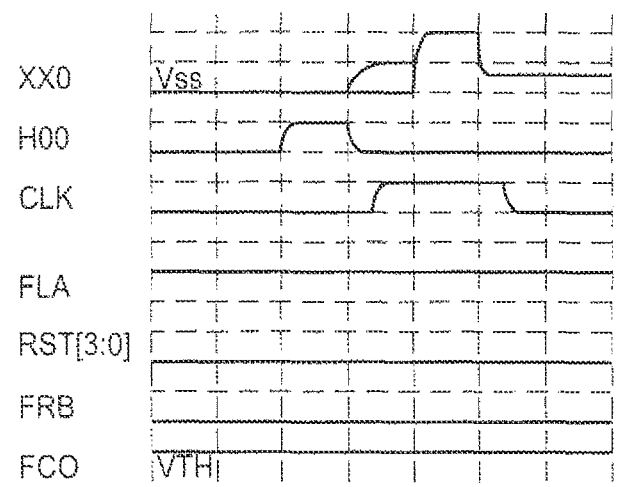
FIGS. 21A and 21B are respective waveforms for a binary program verify operation for the circuits of FIGS. 12 and 19.
Figure 21B:
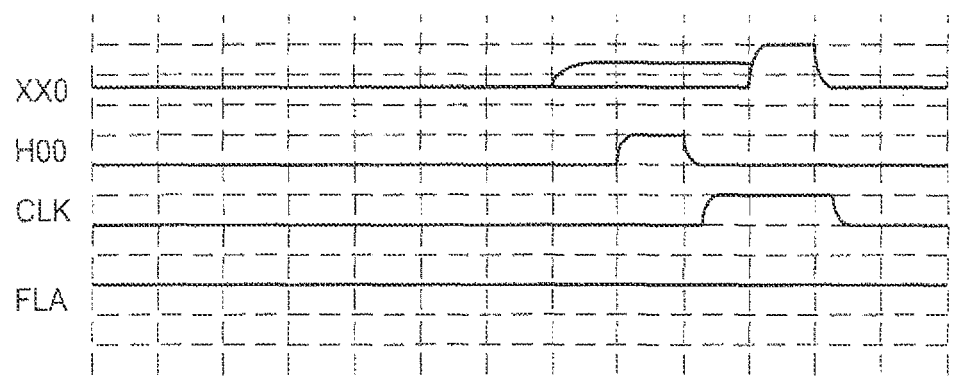

The design of FIG. 19 also allows for the verify operation to be improved with respect to that of FIG. 12. FIGS. 21A and 21B respectively illustrate waveforms for an SLC program verify operation using the circuits of FIGS. 12 and 19.

Considering FIG. 21A first, this shows the waveforms for the SLC program verify for the circuit FIG. 12, as is described further in the corresponding section above. This process has the SEN node pre-charged based upon the FLG value, for which H00 639 and FCO 611 are high. During SEN precharge, the memory has to disable XX0 633 to avoid a direct path current from VDD (BLX 625)→COM (XX0 633)→SEN (H00 639)→MUX (FLG=VSS). Consequently, as shown in FIG. 21A, the XX0 value needs to stay low while H00 is high, without any overlap. (In FIGS. 21A and 21B, the intermediate value of XX0 before it goes fully high is an optional variation, as opposed to keeping it low until taken to its full value.)

In FIG. 19, as H00 739 is now connected between SEN and VDD, rather than MUX, the SEN node can be directly connected to VDD as needed; and, as this cuts of the path between MUX and COM by H00 739 and XX0 733, the high H00 and XX0 values can overlap. This is shown in FIG. 21B, where the hump in the H00 no longer needs to be back to the low voltage level before XX0 can be raised, thereby speeding up operation. The combined changes of FIGS. 20B and 21B can allow an increase of around 5-10 percent in SLC programming performance.

Figure 22A:
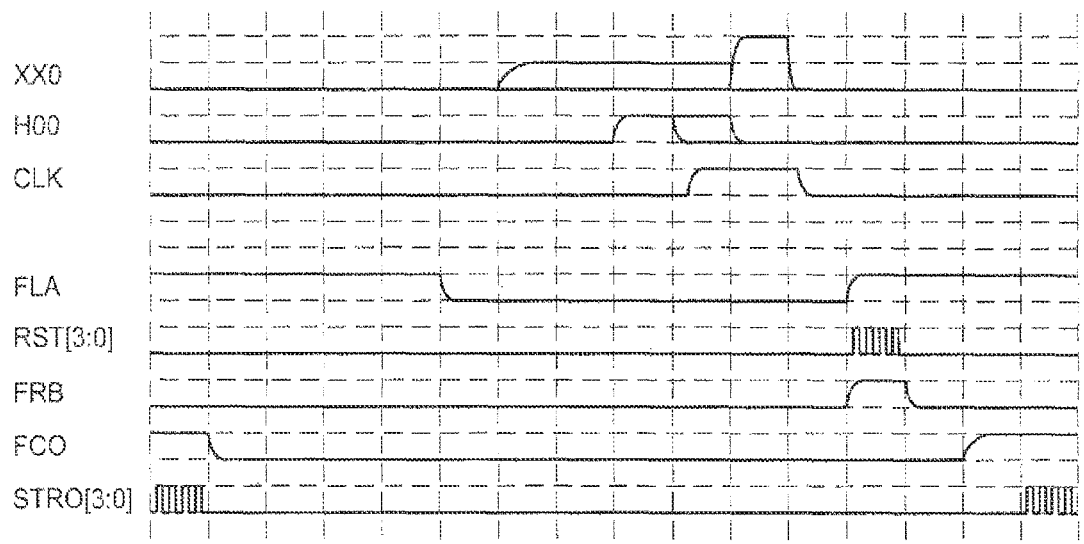
FIGS. 22A and 22B are respective waveforms for a multi-state program verify operation for the circuits of FIGS. 12 and 19.
Figure 22B:
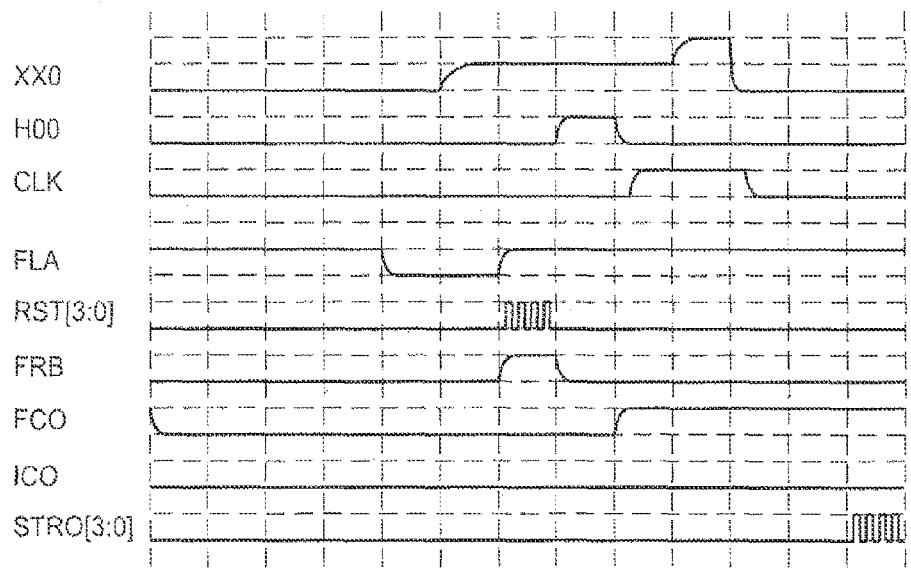

The change in the connection of H00 739 in FIG. 19 relative to H00 639 in FIG. 12 can be used to improve multi-state programming performance. FIGS. 22A and 22B respectively show a MLC program verify operation for the circuits of FIGS. 12 and 19. In the MLC program verify operation using FIG. 12, as illustrated in FIG. 22A (and as described in more detail above), the FLA 615 path is used to pre-charge SEN node. The memory also will need to reset FLG from VSS to VDD before strobing, which cannot be done in FIG. 12 until the pre-charge of the SEN is done. (In FIGS. 22A and 22B the four bumps of the RST signal correspond to the four states in a 2-bit per cell embodiment.)

In the embodiment of FIG. 19, H00 739 can be used to connect the SEN node to VDDSA. This allows the SEN node to be pre-charged without using the FLA 715 path, which in turn allows the SEN pre-charge to be done concurrently with resetting the FLG level. In FIG. 22B, the XX0, H00, and CLK lines are much as before to pre-charge SEN. However, now the RST waveform to reset FLG can now be moved forward to overlap with pre-charge of SEN, along with FRB, the rising of FLA, and the rising FCO all being shifted earlier. This allows the MLC verify to be sped up, improving MLC programming performance by several percent.

Third Embodiment

Figure 23:
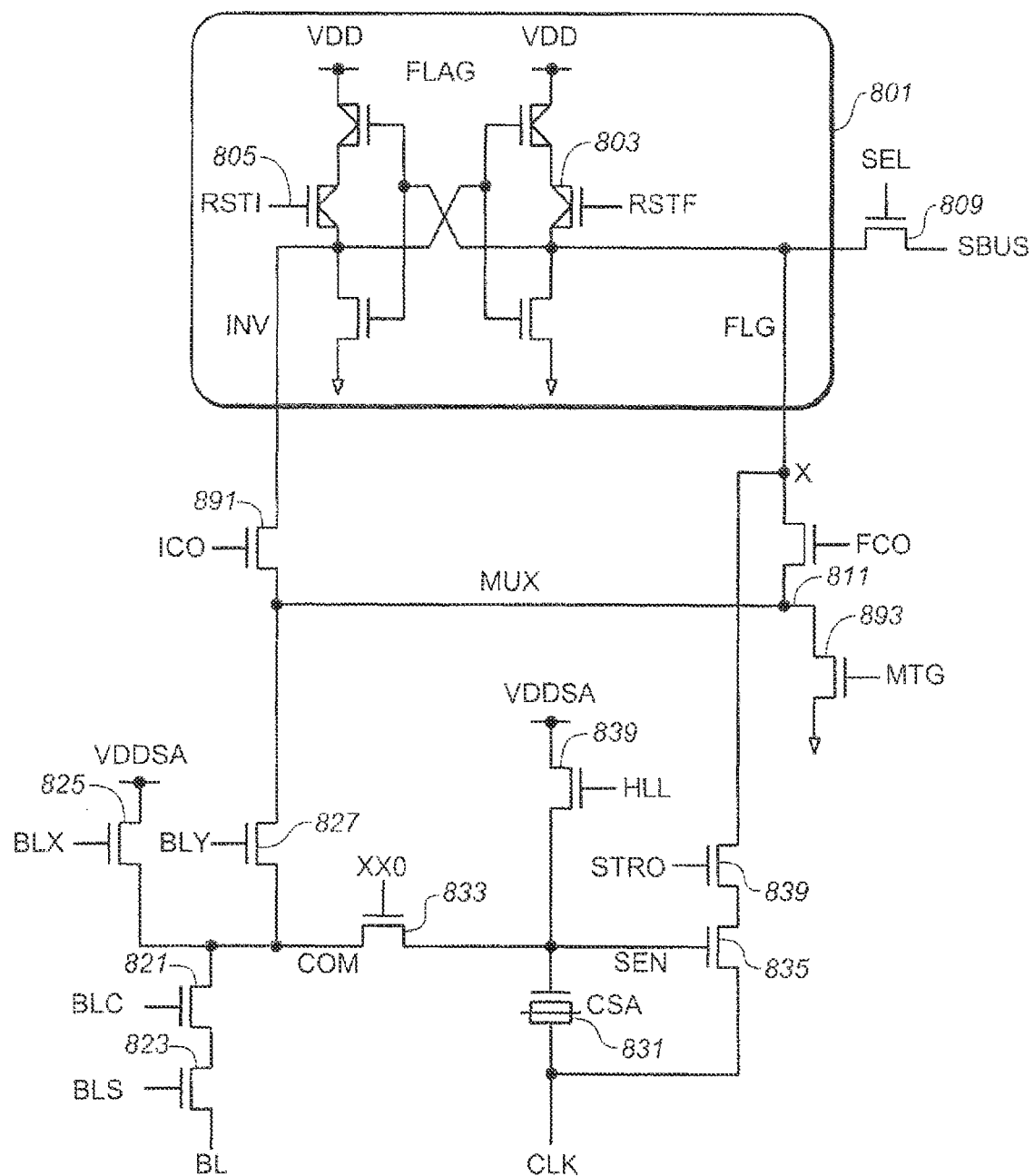
FIG. 23 illustrates schematically a third exemplary embodiment for sense amplifier circuit.

FIG. 23 is a third embodiment of a sense amplified circuit that can achieve faster access time with smaller layout area and less power consumption. In FIG. 23, corresponding elements are numbered similarly to the embodiments of FIGS. 12 and 19, (i.e., FCO is 611, 711 and 811 in the corresponding figures). Relative to the embodiment of FIG. 19, the elements of FLAG 801, ICO 891, and FCO 811 are reversed.

A first difference relates to the power supply connections of the sense amp. To reduce power consumption, the embodiment of this section separates the power supply level of the latch 801 and the power supply level used to drive the bit lines. When in read and verify mode, the sense uses one supply level, such as of 2.5V or more, to drive a bit line. However, there is usually no reason to use such high voltage for data storage and program inhibit operations. For example, a typical program inhibit level requirement for a bit line BL is lower, around 1.8V to 2.0V. In this embodiment, another separate power supply is used for this function, resulting in lower charge consumption during program. Also, because the latch supply level is being reduced, the average current drawn for scan operation and strobe operation is reduced.

This is shown in FIG. 23, where these function are split by having the sense amp connected to the two different supply levels. The level VDD, which is used for the program inhibit, is used at the supply level at the latch FLAG 801, rather than the VDDSA level as in FIG. 19. Outside to the latch, the higher VDDSA level is still connected through BLX 825 and HLL 839 for use in pre-charging bit lines for sense operations. In the exemplary embodiment, VDD is available on the chip as it is used by various peripheral circuit elements and the VDDSA level can also be provided as a regulated level with use of a charge pump.

Another difference from the embodiment of FIG. 19 is that FIG. 23 lacks the elements corresponding to the PMOS transistors 713 and FLA 715, so that the circuit requires less area. The program inhibit level bit line level can be pre charged directly from the INV latch level. As shown in FIG. 23, the only PMOS transistors are RSTF 803 and RSTI 805 of the latch circuit, which are connected only to VDD. As VDD is the common supply level used in the other peripheral logic circuitry on the device, there is no longer a need for two separate NWELLs, one for VDD and one for VDDSA. This can help to minimize the layout area in peripheral circuitry and local buffer area. Use of the lower VDD level in the latch can also help reduce the amount current, and therefore power consumed, in the operation of the FLAG latch 801.

Another difference between FIGS. 19 and 23 is that the reset transistor RST 707 is missing in FIG. 23, which has instead added the switch MTG 893. MTG 893 can discharge the latch node INV (through ICO 891) and also discharge the latch node FLG (though FCO 811). The MTG transistor 893 can also discharge bit line without using latch information. This arrangement allows the circuit to perform operations in parallel, discharging the bit line at the same time as transfers the sensing result out to other latches.

The embodiment of FIG. 23 further differs from the preceding embodiment in the connected in its "strobing" path, the path through STRO 837 from the CLK node to the FLG node of the latch 801. In FIG. 23 this path is connected to the latch node FLG directly at the node marked X above FCO 811, instead of being connected at the MUX node as in FIG. 19. This direct connection removes the need for a pre-charge sequence of the MUX node in order to avoid charge sharing during strobe, when the analog voltage on the SEN node is converted to a digital value (VDDSA or ground/VSS) at FLG.

Conclusion

Although the various aspects of the present invention have been described with respect to certain embodiments, it is understood that the invention is entitled to protection within the full scope of the appended claims.

The invention claimed is:

1. A sense amplifier for a memory circuit, comprising:
a latch circuit, including a first latch node in which a value latched therein is held;
an intermediate circuit, including a first node selectively connected to one or more bit lines and a second node connected to the latch circuit;
bit line selection circuitry connected to the first node, whereby the first node is selectively connected to one or more bit lines;
a first switch connected to the latch circuit and the second node, whereby the first latch node is connected to the second node when the first switch is on and isolate the latch circuit from the second node when the first switch is off;
a second switch, whereby the latch circuit is connected to a data bus;
a third switch whereby the second node is connected to a second latch node of the latch circuit that holds the inverse of said value held in the latch circuit; and
a fourth switch whereby the second node is directly connected to ground.

2. The sense amplifier circuit of claim 1, wherein the intermediate circuit further includes an internal node connected to the first node, the sense amplifier further comprising:
a fifth switch whereby the internal node is selectively connected to a voltage supply level.

3. The sense amplifier circuit of claim 2, further comprising:
a capacitor connected between the internal node and a third node.

4. The sense amplifier circuit of claim 3, further comprising:

a first transistor and a sixth switch connected in series between the third node and the second node, where a control gate of the first transistor is connected to the internal node.

5. The sense amplifier circuit of claim 1, wherein outside of the latch circuit, the switches of the sense amplifier are solely transistors of the NMOS type.

6. The sense amplifier circuit of claim 1, wherein the intermediate circuit further includes an internal node connected to the first node, the sense amplifier, further comprising:
a fifth switch whereby the first node is selectively connected to the internal node.

7. The sense amplifier circuit of claim 1, further comprising:
a fifth switch whereby the first node is selectively connected to the second node.

8. The sense amplifier circuit of claim 1, further comprising:
a fifth switch whereby the first node is selectively connected to a voltage supply level independently of the value held in the latch circuit.

9. The sense amplifier circuit of claim 1, wherein the intermediate circuit further includes an internal node connected to the first node, and wherein the first node of file latch circuit is connected between a first voltage supply level and ground to hold the value latched therein, the sense amplifier further comprising:
a fifth switch whereby the internal node is selectively connected to a second voltage supply level, where the first and second voltage supply levels are supplied from different on-chip supply levels.

10. The sense amplifier circuit of claim 1, wherein the intermediate circuit further includes an internal node connected to the first node, the sense amplifier circuit further comprising:
a first transistor and a fifth switch connected in series, through which a third node and the first latch node are connected independently of the second node, where a control gate of the first transistor is connected to the internal node.

11. A non-volatile memory circuit, comprising:
an array of non-volatile memory cells formed along a plurality of bit lines; and
a sense amplifier, comprising:
a latch circuit, including a first latch node in which a value latched therein is held;
an intermediate circuit, including a first node selectively connected to one or more of the bit lines and a second node connected to the latch circuit;
bit line selection circuitry connected to the first node, whereby the first node is selectively connected to one or more of the bit lines;
a first switch connected to the latch circuit and the second node, whereby the first latch node is connected to the second node when the first switch is on and isolate the latch circuit from the second node when the first switch is off;
a second switch, whereby the latch circuit is connected to a data bus;
a third switch whereby the second node is connected to a second latch node of the latch circuit that holds the inverse of said value held in the latch circuit; and
a fourth switch whereby the second node is directly connected to ground.

12. The non-volatile memory circuit of claim 11, wherein the intermediate circuit further includes an internal node connected to the first node, the sense amplifier further comprising:
a fifth switch whereby the internal node is selectively connected to a voltage supply level.

13. The non-volatile memory circuit of claim 12, wherein the sense amplifier further comprises:
a capacitor connected between the internal node and a third node.

14. The non-volatile memory circuit of claim 13, wherein the sense amplifier further comprises:
a first transistor and a sixth switch connected in series between the third node and the second node, where a control gate of the first transistor is connected to the internal node.

15. The non-volatile memory circuit of claim 11, wherein outside of the latch circuit, the switches of the sense amplifier are transistors are solely of the NMOS type.

16. The non-volatile memory circuit of claim 11, wherein the intermediate circuit further includes an internal node connected to the first node, the sense amplifier, the sense amplifier further comprising:
a fifth switch whereby the first node is selectively connected to the internal node.

17. The non-volatile memory circuit of claim 11, wherein the sense amplifier further comprises:
a fifth switch whereby the first node is selectively connected to the second node.

18. The non-volatile memory circuit of claim 11, wherein the sense amplifier further comprises:
a fifth switch whereby the first node is selectively connected to a voltage supply level independently of the value held in the latch circuit.

19. The non-volatile memory circuit of claim 11, wherein the intermediate circuit further includes an internal node connected to the first node, and wherein the first node of the latch circuit is connected between a first voltage supply level and ground to hold the value latched therein, wherein the sense amplifier further comprises:
a fifth switch whereby the internal node is selectively connected to a second voltage supply level, where the first and second voltage supply levels are supplied from different on-chip supply levels.

20. The non-volatile memory circuit of claim 11, wherein the intermediate circuit further includes an internal node connected to the first node, and wherein the sense amplifier further comprises:
a first transistor and a fifth switch connected in series, through which a third node and the first latch node are connected independently of the second node, where a control gate of the first transistor is connected to the internal node.

* * * * *